(12) United States Patent
Mohammed et al.

(10) Patent No.: US 10,460,958 B2
(45) Date of Patent: Oct. 29, 2019

(54) METHOD OF MANUFACTURING EMBEDDED PACKAGING WITH PREFORMED VIAS

(71) Applicant: Invensas Corporation, San Jose, CA (US)

(72) Inventors: Ilyas Mohammed, San Jose, CA (US); Belgacem Haba, Saratoga, CA (US)

(73) Assignee: Invensas Corporation, San Jose, CA (US)

( * ) Notice: Subject to any disclaimer, the term of this patent is extended or adjusted under 35 U.S.C. 154(b) by 932 days.

(21) Appl. No.: 14/870,823

(22) Filed: Sep. 30, 2015

(65) Prior Publication Data

US 2016/0020121 A1    Jan. 21, 2016

Related U.S. Application Data

(62) Division of application No. 13/961,344, filed on Aug. 7, 2013, now Pat. No. 9,167,710.

(51) Int. Cl.
*H01L 21/56* (2006.01)
*H01L 21/48* (2006.01)
(Continued)

(52) U.S. Cl.
CPC ........ *H01L 21/565* (2013.01); *H01L 21/4846* (2013.01); *H01L 21/4853* (2013.01);
(Continued)

(58) Field of Classification Search
CPC ............... H01L 21/565; H01L 21/4846; H01L 21/4853; H01L 21/568; H01L 24/19;
(Continued)

(56) References Cited

U.S. PATENT DOCUMENTS 2,230,663 A    2/1941    Alden
3,289,452 A    12/1966   Koellner
(Continued)

FOREIGN PATENT DOCUMENTS

CN    1352804 A    6/2002
CN    1641832 A    7/2005
(Continued)

OTHER PUBLICATIONS

Brochure, "High Performance BVA PoP Package for Mobile Systems," Invensas Corporation, May 2013, 20 pages.
(Continued)

*Primary Examiner* — Peter Dungba Vo
*Assistant Examiner* — Azm A Parvez
(74) *Attorney, Agent, or Firm* — Lerner, David, Littenberg, Krumholz & Mentlik, LLP

(57) ABSTRACT

Microelectronic assemblies and methods of making the same are disclosed. In some embodiments, a microelectronic assembly includes a microelectronic element having edge surfaces bounding a front surface and contacts at the front surface; rigid metal posts disposed between at least one edge surface and a corresponding edge of the assembly, each metal post having a sidewall separating first and second end surfaces, the sidewalls have a root mean square (rms) surface roughness of less than about 1 micron; a encapsulation contacting at least the edge surfaces and the sidewalls; an insulation layer overlying the encapsulation; connection elements extending through the insulation layer, wherein at least some connection elements have cross sections smaller than those of the metal posts; a redistribution structure deposited on the insulation layer and electrically connecting first terminals with corresponding metal posts through the first connection elements, some metal posts electrically coupled with contacts of microelectronic element.

20 Claims, 8 Drawing Sheets

(51) Int. Cl.
*H05K 7/00* (2006.01)
*H01L 23/538* (2006.01)
*H01L 23/00* (2006.01)
*H05K 1/18* (2006.01)
*H01L 25/10* (2006.01)

(52) U.S. Cl.
CPC ........ *H01L 21/568* (2013.01); *H01L 23/5389* (2013.01); *H01L 24/19* (2013.01); *H01L 24/20* (2013.01); *H01L 24/24* (2013.01); *H01L 24/96* (2013.01); *H05K 1/185* (2013.01); *H05K 7/00* (2013.01); *H01L 24/32* (2013.01); *H01L 24/73* (2013.01); *H01L 25/105* (2013.01); *H01L 2224/0401* (2013.01); *H01L 2224/04105* (2013.01); *H01L 2224/12105* (2013.01); *H01L 2224/32145* (2013.01); *H01L 2224/73267* (2013.01); *H01L 2225/1035* (2013.01); *H01L 2225/1058* (2013.01); *H01L 2924/12042* (2013.01); *H01L 2924/15311* (2013.01); *H01L 2924/18162* (2013.01); *Y10T 29/49147* (2015.01)

(58) Field of Classification Search
CPC ......... H01L 24/20; H01L 24/24; H01L 24/96; H01L 2224/0401; H01L 2224/04105; H01L 2224/12105; H01L 2224/32145; H01L 2224/73267; H01L 2924/12042; H01L 2924/15311; H01L 2924/18162; Y10T 29/49147
USPC .......... 29/842, 832, 829, 825, 592.1
See application file for complete search history.

(56) References Cited

U.S. PATENT DOCUMENTS

| | | |
|---|---|---|
| 3,358,897 A | 12/1967 | Christensen |
| 3,430,835 A | 3/1969 | Grable et al. |
| 3,623,649 A | 11/1971 | Keisling |
| 3,795,037 A | 3/1974 | Luttmer |
| 3,900,153 A | 8/1975 | Beerwerth et al. |
| 4,067,104 A | 1/1978 | Tracy |
| 4,072,816 A | 2/1978 | Gedney et al. |
| 4,213,556 A | 7/1980 | Persson et al. |
| 4,327,860 A | 5/1982 | Kirshenboin et al. |
| 4,422,568 A | 12/1983 | Elles et al. |
| 4,437,604 A | 3/1984 | Razon et al. |
| 4,604,644 A | 8/1986 | Beckham et al. |
| 4,642,889 A | 2/1987 | Grabbe |
| 4,667,267 A | 5/1987 | Hernandez et al. |
| 4,695,870 A | 9/1987 | Patraw |
| 4,716,049 A | 12/1987 | Patraw |
| 4,725,692 A | 2/1988 | Ishii et al. |
| 4,771,930 A | 9/1988 | Gillotti et al. |
| 4,793,814 A | 12/1988 | Zifcak et al. |
| 4,804,132 A | 2/1989 | DiFrancesco |
| 4,845,354 A | 7/1989 | Gupta et al. |
| 4,902,600 A | 2/1990 | Tamagawa et al. |
| 4,924,353 A | 5/1990 | Patraw |
| 4,925,083 A | 5/1990 | Farassat et al. |
| 4,955,523 A | 9/1990 | Carlommagno et al. |
| 4,975,079 A | 12/1990 | Beaman et al. |
| 4,982,265 A | 1/1991 | Watanabe et al. |
| 4,998,885 A | 3/1991 | Beaman |
| 4,999,472 A | 3/1991 | Neinast et al. |
| 5,067,007 A | 11/1991 | Otsuka et al. |
| 5,067,382 A | 11/1991 | Zimmerman et al. |
| 5,083,697 A | 1/1992 | Difrancesco |
| 5,095,187 A | 3/1992 | Gliga |
| 5,133,495 A | 7/1992 | Angulas et al. |
| 5,138,438 A | 8/1992 | Masayuki et al. |
| 5,148,265 A | 9/1992 | Khandros et al. |
| 5,148,266 A | 9/1992 | Khandros et al. |
| 5,186,381 A | 2/1993 | Kim |
| 5,189,505 A | 2/1993 | Bartelink |
| 5,196,726 A | 3/1993 | Nishiguchi et al. |
| 5,203,075 A | 4/1993 | Angulas et al. |
| 5,214,308 A | 5/1993 | Nishiguchi et al. |
| 5,220,489 A | 6/1993 | Barreto et al. |
| 5,222,014 A | 6/1993 | Lin |
| 5,238,173 A | 8/1993 | Ura et al. |
| 5,241,454 A | 8/1993 | Ameen et al. |
| 5,241,456 A | 8/1993 | Marcinkiewicz et al. |
| 5,316,788 A | 5/1994 | Dibble et al. |
| 5,340,771 A | 8/1994 | Rostoker |
| 5,346,118 A | 9/1994 | Degani et al. |
| 5,371,654 A | 12/1994 | Beaman et al. |
| 5,397,997 A | 3/1995 | Tuckerman et al. |
| 5,438,224 A | 8/1995 | Papageorge et al. |
| 5,455,390 A | 10/1995 | DiStefano et al. |
| 5,468,995 A | 11/1995 | Higgins, III |
| 5,476,211 A | 12/1995 | Khandros |
| 5,494,667 A | 2/1996 | Uchida et al. |
| 5,495,667 A | 3/1996 | Farnworth et al. |
| 5,518,964 A | 5/1996 | DiStefano et al. |
| 5,531,022 A | 7/1996 | Beaman et al. |
| 5,536,909 A | 7/1996 | DiStefano et al. |
| 5,541,567 A | 7/1996 | Fogel et al. |
| 5,571,428 A | 11/1996 | Nishimura et al. |
| 5,578,869 A | 11/1996 | Hoffman et al. |
| 5,608,265 A | 3/1997 | Kitano et al. |
| 5,615,824 A | 4/1997 | Fjelstad et al. |
| 5,616,952 A | 4/1997 | Nakano et al. |
| 5,635,846 A | 6/1997 | Beaman et al. |
| 5,656,550 A | 8/1997 | Tsuji et al. |
| 5,659,952 A | 8/1997 | Kovac et al. |
| 5,679,977 A | 10/1997 | Khandros et al. |
| 5,688,716 A | 11/1997 | DiStefano et al. |
| 5,718,361 A | 2/1998 | Braun et al. |
| 5,726,493 A | 3/1998 | Yamashita et al. |
| 5,731,709 A | 3/1998 | Pastore et al. |
| 5,736,780 A | 4/1998 | Murayama |
| 5,736,785 A | 4/1998 | Chiang et al. |
| 5,766,987 A | 6/1998 | Mitchell et al. |
| 5,787,581 A | 8/1998 | DiStefano et al. |
| 5,801,441 A | 9/1998 | DiStefano et al. |
| 5,802,699 A | 9/1998 | Fjelstad et al. |
| 5,811,982 A | 9/1998 | Beaman et al. |
| 5,821,763 A | 10/1998 | Beaman et al. |
| 5,830,389 A | 11/1998 | Capote et al. |
| 5,831,836 A | 11/1998 | Long et al. |
| 5,839,191 A | 11/1998 | Economy et al. |
| 5,854,507 A | 12/1998 | Miremadi et al. |
| 5,874,781 A | 2/1999 | Fogal et al. |
| 5,898,991 A | 5/1999 | Fogel et al. |
| 5,908,317 A | 6/1999 | Heo |
| 5,912,505 A | 6/1999 | Itoh et al. |
| 5,948,533 A | 9/1999 | Gallagher et al. |
| 5,953,624 A | 9/1999 | Bando et al. |
| 5,971,253 A | 10/1999 | Gilleo et al. |
| 5,973,391 A | 10/1999 | Bischoff et al. |
| 5,977,618 A | 11/1999 | DiStefano et al. |
| 5,977,640 A | 11/1999 | Bertin et al. |
| 5,980,270 A | 11/1999 | Fjelstad et al. |
| 5,989,936 A | 11/1999 | Smith et al. |
| 5,994,152 A | 11/1999 | Khandros et al. |
| 6,000,126 A | 12/1999 | Pai |
| 6,002,168 A | 12/1999 | Bellaar et al. |
| 6,032,359 A | 3/2000 | Carroll |
| 6,038,136 A | 3/2000 | Weber |
| 6,052,287 A | 4/2000 | Palmer et al. |
| 6,054,337 A | 4/2000 | Solberg |
| 6,054,756 A | 4/2000 | DiStefano et al. |
| 6,077,380 A | 6/2000 | Hayes et al. |
| 6,117,694 A | 9/2000 | Smith et al. |
| 6,121,676 A | 9/2000 | Solberg |
| 6,124,546 A | 9/2000 | Hayward et al. |
| 6,133,072 A | 10/2000 | Fjelstad |
| 6,145,733 A | 11/2000 | Streckfuss et al. |
| 6,157,080 A | 12/2000 | Tamaki et al. |
| 6,158,647 A | 12/2000 | Chapman et al. |
| 6,164,523 A | 12/2000 | Fauty et al. |

(56) References Cited

U.S. PATENT DOCUMENTS

| | | |
|---|---|---|
| 6,168,965 B1 | 1/2001 | Malinovich et al. |
| 6,177,636 B1 | 1/2001 | Fjelstad |
| 6,180,881 B1 | 1/2001 | Isaak |
| 6,194,250 B1 | 2/2001 | Melton et al. |
| 6,194,291 B1 | 2/2001 | DiStefano et al. |
| 6,202,297 B1 | 3/2001 | Farad et al. |
| 6,206,273 B1 | 3/2001 | Beaman et al. |
| 6,208,024 B1 | 3/2001 | DiStefano |
| 6,211,572 B1 | 4/2001 | Fjelstad et al. |
| 6,211,574 B1 | 4/2001 | Tao et al. |
| 6,215,670 B1 | 4/2001 | Khandros |
| 6,218,728 B1 | 4/2001 | Kimura |
| 6,225,688 B1 | 5/2001 | Kim et al. |
| 6,238,949 B1 | 5/2001 | Nguyen et al. |
| 6,258,625 B1 | 7/2001 | Brofman et al. |
| 6,260,264 B1 | 7/2001 | Chen et al. |
| 6,262,482 B1 | 7/2001 | Shiraishi et al. |
| 6,268,662 B1 | 7/2001 | Test et al. |
| 6,295,729 B1 | 10/2001 | Beaman et al. |
| 6,300,780 B1 | 10/2001 | Beaman et al. |
| 6,303,997 B1 | 10/2001 | Lee et al. |
| 6,313,528 B1 | 11/2001 | Solberg |
| 6,316,838 B1 | 11/2001 | Ozawa et al. |
| 6,329,224 B1 | 12/2001 | Nguyen et al. |
| 6,332,270 B2 | 12/2001 | Beaman et al. |
| 6,334,247 B1 | 1/2002 | Beaman et al. |
| 6,358,627 B2 | 3/2002 | Benenati et al. |
| 6,362,520 B2 | 3/2002 | DiStefano |
| 6,362,525 B1 | 3/2002 | Rahim |
| 6,376,769 B1 | 4/2002 | Chung |
| 6,388,333 B1 | 5/2002 | Taniguchi et al. |
| 6,395,199 B1 | 5/2002 | Krassowski et al. |
| 6,399,426 B1 | 6/2002 | Capote et al. |
| 6,407,448 B2 | 6/2002 | Chun |
| 6,407,456 B1 | 6/2002 | Ball |
| 6,410,431 B2 | 6/2002 | Bertin et al. |
| 6,413,850 B1 | 7/2002 | Ooroku et al. |
| 6,439,450 B1 | 8/2002 | Chapman et al. |
| 6,458,411 B1 | 10/2002 | Goossen et al. |
| 6,469,260 B2 | 10/2002 | Horiuchi et al. |
| 6,476,503 B1 | 11/2002 | Imamura et al. |
| 6,476,506 B1 | 11/2002 | O'Connor et al. |
| 6,476,583 B2 | 11/2002 | McAndrews |
| 6,486,545 B1 | 11/2002 | Glenn et al. |
| 6,489,182 B2 | 12/2002 | Kwon |
| 6,495,914 B1 | 12/2002 | Sekine et al. |
| 6,507,104 B2 | 1/2003 | Ho et al. |
| 6,509,639 B1 | 1/2003 | Lin |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,526,655 B2 | 3/2003 | Beaman et al. |
| 6,531,784 B1 | 3/2003 | Shim et al. |
| 6,538,336 B1 | 3/2003 | Secker et al. |
| 6,545,228 B2 | 4/2003 | Hashimoto |
| 6,550,666 B2 | 4/2003 | Chew et al. |
| 6,555,918 B2 | 4/2003 | Masuda et al. |
| 6,560,117 B2 | 5/2003 | Moon |
| 6,563,205 B1 | 5/2003 | Fogal et al. |
| 6,573,458 B1 | 6/2003 | Matsubara et al. |
| 6,578,754 B1 | 6/2003 | Tung |
| 6,581,276 B2 | 6/2003 | Chung |
| 6,581,283 B2 | 6/2003 | Sugiura et al. |
| 6,624,653 B1 | 9/2003 | Cram |
| 6,630,730 B2 | 10/2003 | Grigg |
| 6,639,303 B2 | 10/2003 | Siniaguine |
| 6,647,310 B1 | 11/2003 | Yi et al. |
| 6,650,013 B2 | 11/2003 | Yin et al. |
| 6,653,170 B1 | 11/2003 | Lin |
| 6,684,007 B2 | 1/2004 | Yoshimura et al. |
| 6,686,268 B2 | 2/2004 | Farnworth |
| 6,687,988 B1 | 2/2004 | Sugiura et al. |
| 6,696,305 B2 | 2/2004 | Kung et al. |
| 6,699,730 B2 | 3/2004 | Kim et al. |
| 6,708,403 B2 | 3/2004 | Beaman et al. |
| 6,720,783 B2 | 4/2004 | Satoh et al. |
| 6,730,544 B1 | 5/2004 | Yang |
| 6,733,711 B2 | 5/2004 | Durocher et al. |
| 6,734,539 B2 | 5/2004 | Degani et al. |
| 6,734,542 B2 | 5/2004 | Nakatani et al. |
| 6,740,980 B2 | 5/2004 | Hirose |
| 6,741,085 B1 | 5/2004 | Khandros et al. |
| 6,746,894 B2 | 6/2004 | Fee et al. |
| 6,759,738 B1 | 7/2004 | Fallon et al. |
| 6,762,078 B2 | 7/2004 | Shin et al. |
| 6,765,287 B1 | 7/2004 | Lin |
| 6,774,467 B2 | 8/2004 | Horiuchi et al. |
| 6,774,473 B1 | 8/2004 | Shen |
| 6,774,494 B2 | 8/2004 | Arakawa |
| 6,777,787 B2 | 8/2004 | Shibata |
| 6,777,797 B2 | 8/2004 | Egawa |
| 6,778,406 B2 | 8/2004 | Eldridge et al. |
| 6,787,926 B2 | 9/2004 | Chen et al. |
| 6,790,757 B1 | 9/2004 | Chittipeddi et al. |
| 6,812,575 B2 | 11/2004 | Furusawa |
| 6,815,257 B2 | 11/2004 | Yoon et al. |
| 6,828,668 B2 | 12/2004 | Smith et al. |
| 6,844,619 B2 | 1/2005 | Tago |
| 6,856,235 B2 | 2/2005 | Fjelstad |
| 6,864,166 B1 | 3/2005 | Yin et al. |
| 6,867,499 B1 | 3/2005 | Tabrizi |
| 6,874,910 B2 | 4/2005 | Sugimoto et al. |
| 6,897,565 B2 | 5/2005 | Pflughaupt et al. |
| 6,900,530 B1 | 5/2005 | Tsai |
| 6,902,869 B2 | 6/2005 | Appelt et al. |
| 6,902,950 B2 | 6/2005 | Ma et al. |
| 6,906,408 B2 | 6/2005 | Cloud et al. |
| 6,908,785 B2 | 6/2005 | Kim |
| 6,930,256 B1 | 8/2005 | Huemoeller et al. |
| 6,933,608 B2 | 8/2005 | Fujisawa |
| 6,946,380 B2 | 9/2005 | Takahashi |
| 6,962,282 B2 | 11/2005 | Manansala |
| 6,962,864 B1 | 11/2005 | Jeng et al. |
| 6,977,440 B2 | 12/2005 | Pflughaupt et al. |
| 6,979,599 B2 | 12/2005 | Silverbrook |
| 6,987,032 B1 | 1/2006 | Fan et al. |
| 6,989,122 B1 | 1/2006 | Pham et al. |
| 7,009,297 B1 | 3/2006 | Chiang et al. |
| 7,045,884 B2 | 5/2006 | Standing |
| 7,051,915 B2 | 5/2006 | Mutaguchi |
| 7,053,485 B2 | 5/2006 | Bang et al. |
| 7,061,079 B2 | 6/2006 | Weng et al. |
| 7,061,097 B2 | 6/2006 | Yokoi |
| 7,067,911 B1 | 6/2006 | Lin et al. |
| 7,071,547 B2 | 7/2006 | Kang et al. |
| 7,071,573 B1 | 7/2006 | Lin |
| 7,119,427 B2 | 10/2006 | Kim |
| 7,121,891 B2 | 10/2006 | Cherian |
| 7,170,185 B1 | 1/2007 | Hogerton et al. |
| 7,176,506 B2 | 2/2007 | Beroz et al. |
| 7,176,559 B2 | 2/2007 | Ho et al. |
| 7,185,426 B1 | 3/2007 | Hiner et al. |
| 7,190,061 B2 | 3/2007 | Lee |
| 7,198,980 B2 | 4/2007 | Jiang et al. |
| 7,198,987 B1 | 4/2007 | Warren et al. |
| 7,205,670 B2 | 4/2007 | Oyama |
| 7,215,033 B2 | 5/2007 | Lee et al. |
| 7,225,538 B2 | 6/2007 | Eldridge et al. |
| 7,227,095 B2 | 6/2007 | Roberts et al. |
| 7,229,906 B2 | 6/2007 | Babinetz et al. |
| 7,233,057 B2 | 6/2007 | Hussa |
| 7,242,081 B1 | 7/2007 | Lee |
| 7,246,431 B2 | 7/2007 | Bang et al. |
| 7,262,124 B2 | 8/2007 | Fujisawa |
| 7,262,506 B2 | 8/2007 | Mess et al. |
| 7,268,421 B1 | 9/2007 | Lin |
| 7,276,785 B2 | 10/2007 | Bauer et al. |
| 7,276,799 B2 | 10/2007 | Lee et al. |
| 7,287,322 B2 | 10/2007 | Mathieu et al. |
| 7,290,448 B2 | 11/2007 | Shirasaka et al. |
| 7,294,920 B2 | 11/2007 | Chen et al. |
| 7,294,928 B2 | 11/2007 | Bang et al. |
| 7,301,770 B2 | 11/2007 | Campbell et al. |
| 7,323,767 B2 | 1/2008 | James et al. |

(56) References Cited

U.S. PATENT DOCUMENTS

| | | |
|---|---|---|
| 7,327,038 B2 | 2/2008 | Kwon et al. |
| 7,344,917 B2 | 3/2008 | Gautham |
| 7,355,289 B2 | 4/2008 | Hess et al. |
| 7,365,416 B2 | 4/2008 | Kawabata et al. |
| 7,371,676 B2 | 5/2008 | Hembree |
| 7,372,151 B1 | 5/2008 | Fan et al. |
| 7,391,105 B2 | 6/2008 | Yeom |
| 7,391,121 B2 | 6/2008 | Otremba |
| 7,416,107 B2 | 8/2008 | Chapman et al. |
| 7,453,157 B2 | 11/2008 | Haba et al. |
| 7,456,091 B2 | 11/2008 | Kuraya et al. |
| 7,459,348 B2 | 12/2008 | Saeki |
| 7,462,936 B2 | 12/2008 | Haba et al. |
| 7,476,608 B2 | 1/2009 | Craig et al. |
| 7,476,962 B2 | 1/2009 | Kim |
| 7,485,562 B2 | 2/2009 | Chua et al. |
| 7,495,179 B2 | 2/2009 | Kubota et al. |
| 7,495,342 B2 | 2/2009 | Beaman et al. |
| 7,517,733 B2 | 4/2009 | Camacho et al. |
| 7,528,474 B2 | 5/2009 | Lee |
| 7,535,090 B2 | 5/2009 | Furuyama et al. |
| 7,537,962 B2 | 5/2009 | Jang et al. |
| 7,538,565 B1 | 5/2009 | Beaman et al. |
| 7,550,836 B2 | 6/2009 | Chou et al. |
| 7,560,360 B2 | 7/2009 | Cheng et al. |
| 7,576,415 B2 | 8/2009 | Cha et al. |
| 7,576,439 B2 | 8/2009 | Craig et al. |
| 7,578,422 B2 | 8/2009 | Lange et al. |
| 7,582,963 B2 | 9/2009 | Gerber et al. |
| 7,589,394 B2 | 9/2009 | Kawano |
| 7,592,638 B2 | 9/2009 | Kim |
| 7,595,548 B2 | 9/2009 | Shirasaka et al. |
| 7,612,638 B2 | 11/2009 | Chung et al. |
| 7,621,436 B2 | 11/2009 | Mii et al. |
| 7,625,781 B2 | 12/2009 | Beer |
| 7,633,154 B2 | 12/2009 | Dai et al. |
| 7,633,765 B1 | 12/2009 | Scanlan et al. |
| 7,642,133 B2 | 1/2010 | Wu et al. |
| 7,646,102 B2 | 1/2010 | Boon |
| 7,659,617 B2 | 2/2010 | Kang et al. |
| 7,663,226 B2 | 2/2010 | Cho et al. |
| 7,670,940 B2 | 3/2010 | Mizukoshi et al. |
| 7,671,457 B1 | 3/2010 | Hiner et al. |
| 7,671,459 B2 | 3/2010 | Corisis et al. |
| 7,675,152 B2 | 3/2010 | Gerber et al. |
| 7,677,429 B2 | 3/2010 | Chapman et al. |
| 7,682,960 B2 | 3/2010 | Wen |
| 7,682,962 B2 | 3/2010 | Hembree |
| 7,683,460 B2 | 3/2010 | Heitzer et al. |
| 7,692,931 B2 | 4/2010 | Chong et al. |
| 7,696,631 B2 | 4/2010 | Beaulieu et al. |
| 7,706,144 B2 | 4/2010 | Lynch |
| 7,709,968 B2 | 5/2010 | Damberg et al. |
| 7,719,122 B2 | 5/2010 | Tsao et al. |
| 7,728,443 B2 | 6/2010 | Hembree |
| 7,737,545 B2 | 6/2010 | Fjelstad et al. |
| 7,750,483 B1 | 7/2010 | Lin et al. |
| 7,757,385 B2 | 7/2010 | Hembree |
| 7,777,238 B2 | 8/2010 | Nishida et al. |
| 7,777,328 B2 | 8/2010 | Enomoto |
| 7,777,351 B1 | 8/2010 | Berry et al. |
| 7,780,064 B2 | 8/2010 | Wong et al. |
| 7,781,877 B2 | 8/2010 | Jiang et al. |
| 7,795,717 B2 | 9/2010 | Goller |
| 7,800,233 B2 | 9/2010 | Kawano et al. |
| 7,808,093 B2 | 10/2010 | Kagaya et al. |
| 7,808,439 B2 | 10/2010 | Yang et al. |
| 7,842,541 B1 | 11/2010 | Rusli et al. |
| 7,850,087 B2 | 12/2010 | Hwang et al. |
| 7,851,259 B2 | 12/2010 | Kim |
| 7,855,462 B2 | 12/2010 | Boon et al. |
| 7,857,190 B2 | 12/2010 | Takahashi et al. |
| 7,872,335 B2 | 1/2011 | Khan et al. |
| 7,876,180 B2 | 1/2011 | Uchimura |
| 7,880,290 B2 | 2/2011 | Park |
| 7,892,889 B2 | 2/2011 | Howard et al. |
| 7,902,644 B2 | 3/2011 | Huang |
| 7,910,385 B2 | 3/2011 | Kweon et al. |
| 7,911,805 B2 | 3/2011 | Haba |
| 7,919,846 B2 | 4/2011 | Hembree |
| 7,928,552 B1 | 4/2011 | Cho et al. |
| 7,932,170 B1 | 4/2011 | Huemoeller et al. |
| 7,934,313 B1 | 5/2011 | Lin et al. |
| 7,939,934 B2 | 5/2011 | Haba et al. |
| 7,943,436 B2 | 5/2011 | McElvain |
| 7,960,843 B2 | 6/2011 | Hedler et al. |
| 7,964,956 B1 | 6/2011 | Bet-Shliemoun |
| 7,967,062 B2 | 6/2011 | Campbell et al. |
| 7,974,099 B2 | 7/2011 | Grajcar |
| 7,977,597 B2 | 7/2011 | Roberts et al. |
| 7,990,711 B1 | 8/2011 | Andry et al. |
| 8,008,121 B2 | 8/2011 | Choi et al. |
| 8,012,797 B2 | 9/2011 | Shen et al. |
| 8,018,065 B2 | 9/2011 | Lam |
| 8,020,290 B2 | 9/2011 | Sheats |
| 8,035,213 B2 | 10/2011 | Lee et al. |
| 8,039,316 B2 | 10/2011 | Chi et al. |
| 8,039,970 B2 | 10/2011 | Yamamori et al. |
| 8,053,814 B2 | 11/2011 | Chen et al. |
| 8,053,879 B2 | 11/2011 | Lee et al. |
| 8,058,101 B2 | 11/2011 | Haba et al. |
| 8,071,424 B2 | 12/2011 | Haba et al. |
| 8,071,431 B2 | 12/2011 | Hoang et al. |
| 8,071,470 B2 | 12/2011 | Khor et al. |
| 8,076,770 B2 | 12/2011 | Kagaya et al. |
| 8,080,445 B1 | 12/2011 | Pagaila |
| 8,084,867 B2 | 12/2011 | Tang et al. |
| 8,092,734 B2 | 1/2012 | Jiang et al. |
| 8,093,697 B2 | 1/2012 | Haba et al. |
| 8,115,283 B1 | 2/2012 | Bolognia et al. |
| 8,120,054 B2 | 2/2012 | Seo et al. |
| 8,138,584 B2 | 3/2012 | Wang et al. |
| 8,143,141 B2 | 3/2012 | Sugiura et al. |
| 8,174,119 B2 | 5/2012 | Pendse |
| 8,198,716 B2 | 6/2012 | Periaman et al. |
| 8,207,604 B2 | 6/2012 | Haba et al. |
| 8,213,184 B2 | 7/2012 | Knickerbocker |
| 8,217,502 B2 | 7/2012 | Ko |
| 8,232,141 B2 | 7/2012 | Choi et al. |
| 8,264,091 B2 | 9/2012 | Cho et al. |
| 8,278,746 B2 | 10/2012 | Ding et al. |
| 8,288,854 B2 | 10/2012 | Weng et al. |
| 8,299,368 B2 | 10/2012 | Endo |
| 8,304,900 B2 | 11/2012 | Jang et al. |
| 8,314,492 B2 | 11/2012 | Egawa |
| 8,315,060 B2 | 11/2012 | Morikita et al. |
| 8,319,338 B1 | 11/2012 | Berry et al. |
| 8,324,633 B2 | 12/2012 | McKenzie et al. |
| 8,349,735 B2 | 1/2013 | Pagaila et al. |
| 8,354,297 B2 | 1/2013 | Pagaila et al. |
| 8,362,620 B2 | 1/2013 | Pagani |
| 8,372,741 B1 | 2/2013 | Co et al. |
| 8,395,259 B2 | 3/2013 | Eun |
| 8,399,972 B2 | 3/2013 | Hoang et al. |
| 8,404,520 B1 | 3/2013 | Chau et al. |
| 8,409,922 B2 | 4/2013 | Camacho et al. |
| 8,415,704 B2 | 4/2013 | Ivanov et al. |
| 8,419,442 B2 | 4/2013 | Horikawa et al. |
| 8,420,430 B2 | 4/2013 | Chiu et al. |
| 8,476,770 B2 | 7/2013 | Shao et al. |
| 8,482,111 B2 | 7/2013 | Haba |
| 8,507,297 B2 | 8/2013 | Pan et al. |
| 8,508,045 B2 | 8/2013 | Khan et al. |
| 8,520,396 B2 | 8/2013 | Schmidt et al. |
| 8,525,214 B2 | 9/2013 | Lin et al. |
| 8,525,314 B2 | 9/2013 | Haba et al. |
| 8,525,318 B2 | 9/2013 | Kim et al. |
| 8,552,556 B1 | 10/2013 | Kim et al. |
| 8,558,392 B2 | 10/2013 | Chua et al. |
| 8,618,659 B2 | 12/2013 | Sato et al. |
| 8,642,393 B1 | 2/2014 | Yu et al. |
| 8,646,508 B2 | 2/2014 | Kawada |
| 8,653,626 B2 | 2/2014 | Lo et al. |
| 8,653,668 B2 | 2/2014 | Uno et al. |

(56) References Cited

U.S. PATENT DOCUMENTS

| | | |
|---|---|---|
| 8,659,164 B2 | 2/2014 | Haba |
| 8,669,646 B2 | 3/2014 | Tabatabai et al. |
| 8,670,261 B2 | 3/2014 | Crisp et al. |
| 8,680,677 B2 | 3/2014 | Wyland |
| 8,680,684 B2 | 3/2014 | Haba et al. |
| 8,686,570 B2 | 4/2014 | Semmelmeyer et al. |
| 8,728,865 B2 | 5/2014 | Haba et al. |
| 8,729,714 B1 | 5/2014 | Meyer |
| 8,742,576 B2 | 6/2014 | Thacker et al. |
| 8,742,597 B2 | 6/2014 | Nickerson et al. |
| 8,766,436 B2 | 7/2014 | DeLucca et al. |
| 8,772,152 B2 | 7/2014 | Co et al. |
| 8,772,817 B2 | 7/2014 | Yao |
| 8,791,575 B2 | 7/2014 | Oganesian et al. |
| 8,791,580 B2 | 7/2014 | Park et al. |
| 8,796,135 B2 | 8/2014 | Oganesian et al. |
| 8,802,494 B2 | 8/2014 | Lee et al. |
| 8,811,055 B2 | 8/2014 | Yoon |
| 8,816,404 B2 | 8/2014 | Kim et al. |
| 8,816,505 B2 | 8/2014 | Mohammed et al. |
| 8,835,228 B2 | 9/2014 | Mohammed |
| 8,836,136 B2 | 9/2014 | Chau et al. |
| 8,836,147 B2 | 9/2014 | Uno et al. |
| 8,841,765 B2 | 9/2014 | Haba et al. |
| 8,878,353 B2 | 11/2014 | Haba et al. |
| 8,881,086 B2 | 11/2014 | McElvain |
| 8,893,380 B2 | 11/2014 | Kim et al. |
| 8,907,466 B2 | 12/2014 | Haba |
| 8,907,500 B2 | 12/2014 | Haba et al. |
| 8,916,781 B2 | 12/2014 | Haba et al. |
| 8,922,005 B2 | 12/2014 | Hu et al. |
| 8,923,004 B2 | 12/2014 | Low et al. |
| 8,927,337 B2 | 1/2015 | Haba et al. |
| 8,946,757 B2 | 2/2015 | Mohammed et al. |
| 8,948,712 B2 | 2/2015 | Chen et al. |
| 8,963,339 B2 | 2/2015 | He et al. |
| 8,975,726 B2 | 3/2015 | Chen et al. |
| 8,978,247 B2 | 3/2015 | Yang et al. |
| 8,981,559 B2 | 3/2015 | Hsu et al. |
| 8,987,132 B2 | 3/2015 | Gruber et al. |
| 8,988,895 B2 | 3/2015 | Mohammed et al. |
| 8,993,376 B2 | 3/2015 | Camacho et al. |
| 9,012,263 B1 | 4/2015 | Mathew |
| 9,054,095 B2 | 6/2015 | Pagaila |
| 9,093,435 B2 | 7/2015 | Sato et al. |
| 9,095,074 B2 | 7/2015 | Haba et al. |
| 9,105,483 B2 | 8/2015 | Chau et al. |
| 9,117,811 B2 | 8/2015 | Zohni |
| 9,123,664 B2 | 9/2015 | Haba |
| 9,136,254 B2 | 9/2015 | Zhao et al. |
| 9,153,562 B2 | 10/2015 | Haba et al. |
| 9,167,710 B2 | 10/2015 | Mohammed et al. |
| 9,196,586 B2 | 11/2015 | Chen et al. |
| 9,196,588 B2 | 11/2015 | Leal |
| 9,209,081 B2 | 12/2015 | Lim et al. |
| 9,214,434 B1 | 12/2015 | Kim et al. |
| 9,224,647 B2 | 12/2015 | Koo et al. |
| 9,224,717 B2 | 12/2015 | Sato et al. |
| 9,263,394 B2 | 2/2016 | Uzoh et al. |
| 9,263,413 B2 | 2/2016 | Mohammed |
| 9,318,449 B2 | 4/2016 | Hasch et al. |
| 9,318,452 B2 | 4/2016 | Chen et al. |
| 9,324,696 B2 | 4/2016 | Choi et al. |
| 9,330,945 B2 | 5/2016 | Song et al. |
| 9,362,161 B2 | 6/2016 | Chi et al. |
| 9,378,982 B2 | 6/2016 | Lin et al. |
| 9,379,074 B2 | 6/2016 | Uzoh et al. |
| 9,379,078 B2 | 6/2016 | Yu et al. |
| 9,401,338 B2 | 7/2016 | Magnus et al. |
| 9,405,064 B2 | 8/2016 | Herbsommer et al. |
| 9,412,661 B2 | 8/2016 | Lu et al. |
| 9,418,971 B2 | 8/2016 | Chen et al. |
| 9,437,459 B2 | 9/2016 | Carpenter et al. |
| 9,443,797 B2 | 9/2016 | Marimuthu et al. |
| 9,449,941 B2 | 9/2016 | Tsai et al. |
| 9,461,025 B2 | 10/2016 | Yu et al. |
| 9,484,331 B2 | 11/2016 | Paek et al. |
| 9,508,622 B2 | 11/2016 | Higgins, III |
| 9,559,088 B2 | 1/2017 | Gonzalez et al. |
| 9,570,382 B2 | 2/2017 | Haba |
| 9,583,456 B2 | 2/2017 | Uzoh et al. |
| 9,601,454 B2 | 3/2017 | Zhao et al. |
| 9,653,428 B1 | 5/2017 | Hiner et al. |
| 9,653,442 B2 | 5/2017 | Yu et al. |
| 9,659,877 B2 | 5/2017 | Bakalski et al. |
| 9,663,353 B2 | 5/2017 | Ofner et al. |
| 9,735,084 B2 | 8/2017 | Katkar et al. |
| 9,788,466 B2 | 10/2017 | Chen |
| 10,115,678 B2 | 10/2018 | Awujoola et al. |
| 10,181,457 B2 | 1/2019 | Prabhu et al. |
| 2001/0002607 A1 | 6/2001 | Sugiura et al. |
| 2001/0006252 A1 | 7/2001 | Kim et al. |
| 2001/0007370 A1 | 7/2001 | Distefano |
| 2001/0021541 A1 | 9/2001 | Akram et al. |
| 2001/0028114 A1 | 10/2001 | Hosomi |
| 2001/0040280 A1 | 11/2001 | Funakura et al. |
| 2001/0042925 A1 | 11/2001 | Yamamoto et al. |
| 2001/0045012 A1 | 11/2001 | Beaman et al. |
| 2001/0048151 A1 | 12/2001 | Chun |
| 2002/0014004 A1 | 2/2002 | Beaman et al. |
| 2002/0027257 A1 | 3/2002 | Kinsman et al. |
| 2002/0066952 A1 | 6/2002 | Taniguchi et al. |
| 2002/0096787 A1 | 7/2002 | Fjelstad |
| 2002/0113308 A1 | 8/2002 | Huang et al. |
| 2002/0117330 A1 | 8/2002 | Eldridge et al. |
| 2002/0125556 A1 | 9/2002 | Oh et al. |
| 2002/0125571 A1 | 9/2002 | Corisis et al. |
| 2002/0153602 A1 | 10/2002 | Tay et al. |
| 2002/0164838 A1 | 11/2002 | Moon et al. |
| 2002/0171152 A1 | 11/2002 | Miyazaki |
| 2002/0185735 A1 | 12/2002 | Sakurai et al. |
| 2002/0190738 A1 | 12/2002 | Beaman et al. |
| 2003/0002770 A1 | 1/2003 | Chakravorty et al. |
| 2003/0006494 A1 | 1/2003 | Lee et al. |
| 2003/0048108 A1 | 3/2003 | Beaman et al. |
| 2003/0057544 A1 | 3/2003 | Nathan et al. |
| 2003/0068906 A1 | 4/2003 | Light et al. |
| 2003/0094666 A1 | 5/2003 | Clayton et al. |
| 2003/0094685 A1 | 5/2003 | Shiraishi et al. |
| 2003/0094700 A1 | 5/2003 | Aiba et al. |
| 2003/0106213 A1 | 6/2003 | Beaman et al. |
| 2003/0107118 A1 | 6/2003 | Pflughaupt et al. |
| 2003/0124767 A1 | 7/2003 | Lee et al. |
| 2003/0162378 A1 | 8/2003 | Mikami |
| 2003/0164540 A1 | 9/2003 | Lee et al. |
| 2003/0234277 A1 | 12/2003 | Dias et al. |
| 2004/0014309 A1 | 1/2004 | Nakanishi |
| 2004/0036164 A1 | 2/2004 | Koike et al. |
| 2004/0038447 A1 | 2/2004 | Corisis et al. |
| 2004/0041757 A1 | 3/2004 | Yang et al. |
| 2004/0075164 A1 | 4/2004 | Pu et al. |
| 2004/0090756 A1 | 5/2004 | Ho et al. |
| 2004/0110319 A1 | 6/2004 | Fukutomi et al. |
| 2004/0119152 A1 | 6/2004 | Karnezos et al. |
| 2004/0124518 A1 | 7/2004 | Karnezos |
| 2004/0148773 A1 | 8/2004 | Beaman et al. |
| 2004/0152292 A1 | 8/2004 | Babinetz et al. |
| 2004/0160751 A1 | 8/2004 | Inagaki et al. |
| 2004/0164426 A1 | 8/2004 | Pai et al. |
| 2004/0188499 A1 | 9/2004 | Nosaka |
| 2004/0262728 A1 | 12/2004 | Sterrett et al. |
| 2004/0262734 A1 | 12/2004 | Yoo |
| 2005/0017369 A1 | 1/2005 | Clayton et al. |
| 2005/0035440 A1 | 2/2005 | Mohammed |
| 2005/0062173 A1 | 3/2005 | Vu et al. |
| 2005/0062492 A1 | 3/2005 | Beaman et al. |
| 2005/0082664 A1 | 4/2005 | Funaba et al. |
| 2005/0095835 A1 | 5/2005 | Humpston et al. |
| 2005/0116326 A1 | 6/2005 | Haba et al. |
| 2005/0121764 A1 | 6/2005 | Mallik et al. |
| 2005/0133916 A1 | 6/2005 | Kamezos |
| 2005/0133932 A1 | 6/2005 | Pohl et al. |
| 2005/0140265 A1 | 6/2005 | Hirakata |
| 2005/0146008 A1 | 7/2005 | Miyamoto et al. |

(56) References Cited

U.S. PATENT DOCUMENTS

| | | |
|---|---|---|
| 2005/0151235 A1 | 7/2005 | Yokoi |
| 2005/0151238 A1 | 7/2005 | Yamunan |
| 2005/0161814 A1 | 7/2005 | Mizukoshi et al. |
| 2005/0173805 A1 | 8/2005 | Damberg et al. |
| 2005/0173807 A1 | 8/2005 | Zhu et al. |
| 2005/0176233 A1 | 8/2005 | Joshi et al. |
| 2005/0181544 A1 | 8/2005 | Haba et al. |
| 2005/0181655 A1 | 8/2005 | Haba et al. |
| 2005/0212109 A1 | 9/2005 | Cherukuri et al. |
| 2005/0253213 A1 | 11/2005 | Jiang et al. |
| 2005/0266672 A1 | 12/2005 | Jeng et al. |
| 2005/0285246 A1 | 12/2005 | Haba et al. |
| 2006/0087013 A1 | 4/2006 | Hsieh |
| 2006/0088957 A1 | 4/2006 | Saeki |
| 2006/0118641 A1 | 6/2006 | Hwang et al. |
| 2006/0139893 A1 | 6/2006 | Yoshimura et al. |
| 2006/0166397 A1 | 7/2006 | Lau et al. |
| 2006/0197220 A1 | 9/2006 | Beer |
| 2006/0216868 A1 | 9/2006 | Yang et al. |
| 2006/0228825 A1 | 10/2006 | Hembree |
| 2006/0255449 A1 | 11/2006 | Lee et al. |
| 2006/0278682 A1 | 12/2006 | Lange et al. |
| 2006/0278970 A1 | 12/2006 | Yano et al. |
| 2007/0010086 A1 | 1/2007 | Hsieh |
| 2007/0013067 A1 | 1/2007 | Nishida et al. |
| 2007/0015353 A1 | 1/2007 | Craig et al. |
| 2007/0026662 A1 | 2/2007 | Kawano et al. |
| 2007/0035015 A1 | 2/2007 | Hsu |
| 2007/0045803 A1 | 3/2007 | Ye et al. |
| 2007/0045862 A1 | 3/2007 | Corisis et al. |
| 2007/0080360 A1 | 4/2007 | Mirsky et al. |
| 2007/0090524 A1 | 4/2007 | Abbott |
| 2007/0126091 A1 | 6/2007 | Wood et al. |
| 2007/0145563 A1 | 6/2007 | Punzalan et al. |
| 2007/0148822 A1 | 6/2007 | Haba et al. |
| 2007/0164457 A1 | 7/2007 | Yamaguchi et al. |
| 2007/0181989 A1 | 8/2007 | Corisis et al. |
| 2007/0190747 A1 | 8/2007 | Humpston et al. |
| 2007/0235850 A1 | 10/2007 | Gerber et al. |
| 2007/0235856 A1 | 10/2007 | Haba et al. |
| 2007/0238289 A1* | 10/2007 | Tanaka ............... H01L 21/76819 438/663 |
| 2007/0241437 A1 | 10/2007 | Kagaya et al. |
| 2007/0246819 A1 | 10/2007 | Hembree et al. |
| 2007/0254406 A1 | 11/2007 | Lee |
| 2007/0271781 A9 | 11/2007 | Beaman et al. |
| 2007/0290325 A1 | 12/2007 | Wu et al. |
| 2008/0006942 A1 | 1/2008 | Park et al. |
| 2008/0017968 A1 | 1/2008 | Choi et al. |
| 2008/0023805 A1 | 1/2008 | Howard et al. |
| 2008/0029849 A1 | 2/2008 | Hedler et al. |
| 2008/0032519 A1 | 2/2008 | Murata |
| 2008/0042265 A1 | 2/2008 | Menlo et al. |
| 2008/0047741 A1 | 2/2008 | Beaman et al. |
| 2008/0048309 A1 | 2/2008 | Corisis et al. |
| 2008/0048690 A1 | 2/2008 | Beaman et al. |
| 2008/0048691 A1 | 2/2008 | Beaman et al. |
| 2008/0048697 A1 | 2/2008 | Beaman et al. |
| 2008/0054434 A1 | 3/2008 | Kim |
| 2008/0073769 A1 | 3/2008 | Wu et al. |
| 2008/0073771 A1 | 3/2008 | Seo et al. |
| 2008/0076208 A1 | 3/2008 | Wu et al. |
| 2008/0100316 A1 | 5/2008 | Beaman et al. |
| 2008/0100317 A1 | 5/2008 | Beaman et al. |
| 2008/0100318 A1 | 5/2008 | Beaman et al. |
| 2008/0100324 A1 | 5/2008 | Beaman et al. |
| 2008/0105984 A1 | 5/2008 | Lee |
| 2008/0106281 A1 | 5/2008 | Beaman et al. |
| 2008/0106282 A1 | 5/2008 | Beaman et al. |
| 2008/0106283 A1 | 5/2008 | Beaman et al. |
| 2008/0106284 A1 | 5/2008 | Beaman et al. |
| 2008/0106285 A1 | 5/2008 | Beaman et al. |
| 2008/0106291 A1 | 5/2008 | Beaman et al. |
| 2008/0106872 A1 | 5/2008 | Beaman et al. |
| 2008/0110667 A1 | 5/2008 | Ahn et al. |
| 2008/0111568 A1 | 5/2008 | Beaman et al. |
| 2008/0111569 A1 | 5/2008 | Beaman et al. |
| 2008/0111570 A1 | 5/2008 | Beaman et al. |
| 2008/0112144 A1 | 5/2008 | Beaman et al. |
| 2008/0112145 A1 | 5/2008 | Beaman et al. |
| 2008/0112146 A1 | 5/2008 | Beaman et al. |
| 2008/0112147 A1 | 5/2008 | Beaman et al. |
| 2008/0112148 A1 | 5/2008 | Beaman et al. |
| 2008/0112149 A1 | 5/2008 | Beaman et al. |
| 2008/0116912 A1 | 5/2008 | Beaman et al. |
| 2008/0116913 A1 | 5/2008 | Beaman et al. |
| 2008/0116914 A1 | 5/2008 | Beaman et al. |
| 2008/0116915 A1 | 5/2008 | Beaman et al. |
| 2008/0116916 A1 | 5/2008 | Beaman et al. |
| 2008/0117611 A1 | 5/2008 | Beaman et al. |
| 2008/0117612 A1 | 5/2008 | Beaman et al. |
| 2008/0117613 A1 | 5/2008 | Beaman et al. |
| 2008/0121879 A1 | 5/2008 | Beaman et al. |
| 2008/0123310 A1 | 5/2008 | Beaman et al. |
| 2008/0129319 A1 | 6/2008 | Beaman et al. |
| 2008/0129320 A1 | 6/2008 | Beaman et al. |
| 2008/0132094 A1 | 6/2008 | Beaman et al. |
| 2008/0156518 A1 | 7/2008 | Honer et al. |
| 2008/0164595 A1 | 7/2008 | Wu et al. |
| 2008/0169544 A1 | 7/2008 | Tanaka et al. |
| 2008/0169548 A1 | 7/2008 | Baek |
| 2008/0211084 A1 | 9/2008 | Chow et al. |
| 2008/0217708 A1 | 9/2008 | Reisner et al. |
| 2008/0230887 A1 | 9/2008 | Sun et al. |
| 2008/0246126 A1 | 10/2008 | Bowles et al. |
| 2008/0277772 A1 | 11/2008 | Groenhuis et al. |
| 2008/0280393 A1 | 11/2008 | Lee et al. |
| 2008/0284001 A1 | 11/2008 | Mori et al. |
| 2008/0284045 A1 | 11/2008 | Gerber et al. |
| 2008/0303132 A1 | 12/2008 | Mohammed et al. |
| 2008/0303153 A1 | 12/2008 | Oi et al. |
| 2008/0308305 A1 | 12/2008 | Kawabe |
| 2008/0315385 A1 | 12/2008 | Gerber et al. |
| 2009/0008796 A1 | 1/2009 | Eng et al. |
| 2009/0014876 A1 | 1/2009 | Youn et al. |
| 2009/0026609 A1 | 1/2009 | Masuda |
| 2009/0032913 A1 | 2/2009 | Haba |
| 2009/0039523 A1 | 2/2009 | Jiang et al. |
| 2009/0045497 A1 | 2/2009 | Kagaya et al. |
| 2009/0050994 A1 | 2/2009 | Ishihara et al. |
| 2009/0079094 A1 | 3/2009 | Lin |
| 2009/0085185 A1 | 4/2009 | Byun et al. |
| 2009/0085205 A1 | 4/2009 | Sugizaki |
| 2009/0091009 A1 | 4/2009 | Corisis et al. |
| 2009/0091022 A1 | 4/2009 | Meyer et al. |
| 2009/0102063 A1 | 4/2009 | Lee et al. |
| 2009/0104736 A1 | 4/2009 | Haba et al. |
| 2009/0115044 A1 | 5/2009 | Hoshino et al. |
| 2009/0115047 A1 | 5/2009 | Haba et al. |
| 2009/0121351 A1 | 5/2009 | Endo |
| 2009/0127686 A1 | 5/2009 | Yang et al. |
| 2009/0128176 A1 | 5/2009 | Beaman et al. |
| 2009/0140415 A1 | 6/2009 | Furuta |
| 2009/0146301 A1 | 6/2009 | Shimizu et al. |
| 2009/0146303 A1 | 6/2009 | Kwon |
| 2009/0160065 A1 | 6/2009 | Haba et al. |
| 2009/0166664 A1 | 7/2009 | Park et al. |
| 2009/0166873 A1 | 7/2009 | Yang et al. |
| 2009/0189288 A1 | 7/2009 | Beaman et al. |
| 2009/0194829 A1 | 8/2009 | Chung |
| 2009/0206461 A1 | 8/2009 | Yoon |
| 2009/0212418 A1 | 8/2009 | Gurrum et al. |
| 2009/0212442 A1 | 8/2009 | Chow et al. |
| 2009/0236700 A1 | 9/2009 | Moriya |
| 2009/0236753 A1 | 9/2009 | Moon et al. |
| 2009/0239336 A1 | 9/2009 | Lee et al. |
| 2009/0256229 A1 | 10/2009 | Ishikawa et al. |
| 2009/0260228 A1 | 10/2009 | Val |
| 2009/0261466 A1 | 10/2009 | Pagaila et al. |
| 2009/0302445 A1 | 12/2009 | Pagaila et al. |
| 2009/0315579 A1 | 12/2009 | Beaman et al. |
| 2009/0316378 A1 | 12/2009 | Haba et al. |
| 2010/0000775 A1 | 1/2010 | Shen et al. |
| 2010/0003822 A1 | 1/2010 | Miyata et al. |

(56) References Cited

U.S. PATENT DOCUMENTS

| | | |
|---|---|---|
| 2010/0006963 A1 | 1/2010 | Brady |
| 2010/0007009 A1 | 1/2010 | Chang et al. |
| 2010/0007026 A1 | 1/2010 | Shikano |
| 2010/0025835 A1 | 2/2010 | Oh et al. |
| 2010/0032822 A1 | 2/2010 | Liao et al. |
| 2010/0044860 A1 | 2/2010 | Haba et al. |
| 2010/0052135 A1 | 3/2010 | Shim et al. |
| 2010/0052187 A1 | 3/2010 | Lee et al. |
| 2010/0072588 A1 | 3/2010 | Yang |
| 2010/0078789 A1 | 4/2010 | Choi et al. |
| 2010/0078795 A1 | 4/2010 | Dekker et al. |
| 2010/0087035 A1 | 4/2010 | Yoo et al. |
| 2010/0090330 A1 | 4/2010 | Nakazato |
| 2010/0109138 A1 | 5/2010 | Cho |
| 2010/0117212 A1 | 5/2010 | Corisis et al. |
| 2010/0133675 A1 | 6/2010 | Yu et al. |
| 2010/0148360 A1 | 6/2010 | Lin et al. |
| 2010/0148374 A1 | 6/2010 | Castro |
| 2010/0171205 A1 | 7/2010 | Chen et al. |
| 2010/0193937 A1 | 8/2010 | Nagamatsu et al. |
| 2010/0200981 A1 | 8/2010 | Huang et al. |
| 2010/0213560 A1 | 8/2010 | Wang et al. |
| 2010/0216281 A1 | 8/2010 | Pagaila et al. |
| 2010/0224975 A1 | 9/2010 | Shin et al. |
| 2010/0232119 A1 | 9/2010 | Schmidt et al. |
| 2010/0232129 A1 | 9/2010 | Haba et al. |
| 2010/0237471 A1 | 9/2010 | Pagaila et al. |
| 2010/0246141 A1 | 9/2010 | Leung et al. |
| 2010/0258955 A1 | 10/2010 | Miyagawa et al. |
| 2010/0289142 A1 | 11/2010 | Shim et al. |
| 2010/0314748 A1 | 12/2010 | Hsu et al. |
| 2010/0320585 A1 | 12/2010 | Jiang et al. |
| 2010/0327419 A1 | 12/2010 | Muthukumar et al. |
| 2011/0042699 A1 | 2/2011 | Park et al. |
| 2011/0057308 A1 | 3/2011 | Choi et al. |
| 2011/0068453 A1 | 3/2011 | Cho et al. |
| 2011/0068478 A1 | 3/2011 | Pagaila et al. |
| 2011/0115081 A1 | 5/2011 | Osumi |
| 2011/0140259 A1 | 6/2011 | Cho et al. |
| 2011/0147911 A1 | 6/2011 | Kohl et al. |
| 2011/0156249 A1 | 6/2011 | Chang et al. |
| 2011/0157834 A1 | 6/2011 | Wang |
| 2011/0175213 A1 | 7/2011 | Mori et al. |
| 2011/0209908 A1 | 9/2011 | Lin et al. |
| 2011/0215472 A1 | 9/2011 | Chandrasekaran |
| 2011/0220395 A1 | 9/2011 | Cho et al. |
| 2011/0223721 A1 | 9/2011 | Cho et al. |
| 2011/0237027 A1 | 9/2011 | Kim et al. |
| 2011/0241192 A1 | 10/2011 | Ding et al. |
| 2011/0241193 A1 | 10/2011 | Ding et al. |
| 2011/0272449 A1 | 11/2011 | Pirkle et al. |
| 2011/0272798 A1 | 11/2011 | Lee et al. |
| 2012/0001336 A1 | 1/2012 | Zeng et al. |
| 2012/0007232 A1 | 1/2012 | Haba |
| 2012/0015481 A1 | 1/2012 | Kim |
| 2012/0018885 A1 | 1/2012 | Lee et al. |
| 2012/0020026 A1 | 1/2012 | Oganesian et al. |
| 2012/0025365 A1 | 2/2012 | Haba |
| 2012/0034777 A1 | 2/2012 | Pagaila et al. |
| 2012/0043655 A1 | 2/2012 | Khor et al. |
| 2012/0056312 A1 | 3/2012 | Pagaila et al. |
| 2012/0061814 A1 | 3/2012 | Camacho et al. |
| 2012/0063090 A1 | 3/2012 | Hsiao et al. |
| 2012/0080787 A1 | 4/2012 | Shah et al. |
| 2012/0086111 A1 | 4/2012 | Iwamoto et al. |
| 2012/0086130 A1 | 4/2012 | Sasaki et al. |
| 2012/0104595 A1 | 5/2012 | Haba et al. |
| 2012/0104624 A1 | 5/2012 | Choi et al. |
| 2012/0119380 A1 | 5/2012 | Haba |
| 2012/0126431 A1 | 5/2012 | Kim et al. |
| 2012/0145442 A1 | 6/2012 | Gupta et al. |
| 2012/0146235 A1 | 6/2012 | Choi et al. |
| 2012/0153444 A1 | 6/2012 | Naga et al. |
| 2012/0184116 A1 | 7/2012 | Pawlikowski et al. |
| 2012/0280374 A1 | 11/2012 | Choi et al. |
| 2012/0280386 A1 | 11/2012 | Sato et al. |
| 2012/0286432 A1 | 11/2012 | Do et al. |
| 2012/0305916 A1 | 12/2012 | Liu et al. |
| 2012/0326337 A1 | 12/2012 | Camacho et al. |
| 2013/0001797 A1 | 1/2013 | Choi et al. |
| 2013/0032944 A1 | 2/2013 | Sato et al. |
| 2013/0037802 A1 | 2/2013 | England et al. |
| 2013/0040423 A1 | 2/2013 | Tung et al. |
| 2013/0049218 A1* | 2/2013 | Gong ............... H01L 24/19 257/774 |
| 2013/0049221 A1 | 2/2013 | Han et al. |
| 2013/0069222 A1* | 3/2013 | Camacho ......... H01L 23/49827 257/737 |
| 2013/0082399 A1 | 4/2013 | Kim et al. |
| 2013/0087915 A1 | 4/2013 | Warren et al. |
| 2013/0093087 A1 | 4/2013 | Chau et al. |
| 2013/0093088 A1 | 4/2013 | Chau et al. |
| 2013/0093091 A1 | 4/2013 | Ma et al. |
| 2013/0095610 A1 | 4/2013 | Chau et al. |
| 2013/0105979 A1 | 5/2013 | Yu et al. |
| 2013/0134588 A1 | 5/2013 | Yu et al. |
| 2013/0153646 A1 | 6/2013 | Ho |
| 2013/0182402 A1 | 7/2013 | Chen et al. |
| 2013/0200524 A1 | 8/2013 | Han et al. |
| 2013/0200533 A1 | 8/2013 | Chau et al. |
| 2013/0234317 A1 | 9/2013 | Chen et al. |
| 2013/0241083 A1 | 9/2013 | Yu et al. |
| 2013/0256847 A1 | 10/2013 | Park et al. |
| 2013/0313716 A1 | 11/2013 | Mohammed |
| 2013/0323409 A1 | 12/2013 | Read et al. |
| 2014/0021605 A1 | 1/2014 | Yu et al. |
| 2014/0035892 A1 | 2/2014 | Shenoy et al. |
| 2014/0036454 A1 | 2/2014 | Caskey et al. |
| 2014/0103527 A1 | 4/2014 | Marimuthu et al. |
| 2014/0124949 A1 | 5/2014 | Paek et al. |
| 2014/0175657 A1 | 6/2014 | Oka et al. |
| 2014/0220744 A1 | 8/2014 | Damberg et al. |
| 2014/0225248 A1 | 8/2014 | Henderson et al. |
| 2014/0239479 A1 | 8/2014 | Start |
| 2014/0239490 A1 | 8/2014 | Wang |
| 2014/0264945 A1 | 9/2014 | Yap et al. |
| 2014/0312503 A1 | 10/2014 | Seo |
| 2015/0017765 A1 | 1/2015 | Co et al. |
| 2015/0043190 A1 | 2/2015 | Mohammed et al. |
| 2015/0044823 A1 | 2/2015 | Mohammed |
| 2015/0076714 A1 | 3/2015 | Haba et al. |
| 2015/0130054 A1 | 5/2015 | Lee et al. |
| 2015/0340305 A1 | 11/2015 | Lo |
| 2015/0380376 A1 | 12/2015 | Mathew et al. |
| 2016/0043813 A1 | 2/2016 | Chen et al. |
| 2016/0225692 A1 | 8/2016 | Kim et al. |
| 2017/0117231 A1 | 4/2017 | Awujoola et al. |
| 2017/0229432 A1 | 8/2017 | Lin et al. |

FOREIGN PATENT DOCUMENTS

| | | |
|---|---|---|
| CN | 1877824 A | 12/2006 |
| CN | 101409241 A | 4/2009 |
| CN | 101449375 A | 6/2009 |
| CN | 101675516 A | 3/2010 |
| CN | 101819959 A | 9/2010 |
| CN | 102324418 A | 1/2012 |
| DE | 102009001461 A1 | 9/2010 |
| EP | 920058 | 6/1999 |
| EP | 1449414 A1 | 8/2004 |
| EP | 2234158 A1 | 9/2010 |
| JP | S51-050661 | 5/1976 |
| JP | 59189069 | 10/1984 |
| JP | 61125062 | 6/1986 |
| JP | S62158338 A | 7/1987 |
| JP | 62-226307 | 10/1987 |
| JP | 1012769 A | 1/1989 |
| JP | 64-71162 | 3/1989 |
| JP | H04-346436 A | 12/1992 |
| JP | 06268015 A | 9/1994 |
| JP | H06268101 A | 9/1994 |
| JP | H06333931 A | 12/1994 |
| JP | 07-122787 A | 5/1995 |
| JP | 09505439 | 5/1997 |

(56) References Cited

FOREIGN PATENT DOCUMENTS

| | | |
|---|---|---|
| JP | H1065054 A | 3/1998 |
| JP | H10-135221 A | 5/1998 |
| JP | H10135220 A | 5/1998 |
| JP | 1118364 | 1/1999 |
| JP | 11-074295 A | 3/1999 |
| JP | 11135663 A | 5/1999 |
| JP | H11-145323 A | 5/1999 |
| JP | 11251350 A | 9/1999 |
| JP | H11-260856 A | 9/1999 |
| JP | 11317476 | 11/1999 |
| JP | 2000156461 A | 6/2000 |
| JP | 2000323516 A | 11/2000 |
| JP | 3157134 B2 | 4/2001 |
| JP | 2001196407 A | 7/2001 |
| JP | 2001326236 A | 11/2001 |
| JP | 2002050871 A | 2/2002 |
| JP | 2002289769 A | 10/2002 |
| JP | 2003122611 A | 4/2003 |
| JP | 2003-174124 A | 6/2003 |
| JP | 2003197668 A | 7/2003 |
| JP | 2003307897 A | 10/2003 |
| JP | 2003318327 A | 11/2003 |
| JP | 2004031754 A | 1/2004 |
| JP | 200447702 | 2/2004 |
| JP | 2004047702 A | 2/2004 |
| JP | 2004048048 A | 2/2004 |
| JP | 2004-172157 A | 6/2004 |
| JP | 2004200316 A | 7/2004 |
| JP | 2004281514 A | 10/2004 |
| JP | 2004-319892 A | 11/2004 |
| JP | 2004327855 A | 11/2004 |
| JP | 2004327856 A | 11/2004 |
| JP | 2004343030 A | 12/2004 |
| JP | 2005011874 A | 1/2005 |
| JP | 2005033141 A | 2/2005 |
| JP | 2005093551 A | 4/2005 |
| JP | 2003377641 A | 6/2005 |
| JP | 2005142378 A | 6/2005 |
| JP | 2005175019 A | 6/2005 |
| JP | 2003426392 A | 7/2005 |
| JP | 2005183880 A | 7/2005 |
| JP | 2005183923 A | 7/2005 |
| JP | 2005203497 A | 7/2005 |
| JP | 2005302765 A | 10/2005 |
| JP | 2006108588 A | 4/2006 |
| JP | 2006186086 A | 7/2006 |
| JP | 2006344917 | 12/2006 |
| JP | 2007123595 A | 5/2007 |
| JP | 2007-208159 A | 8/2007 |
| JP | 2007194436 A | 8/2007 |
| JP | 2007234845 A | 9/2007 |
| JP | 2007287922 A | 11/2007 |
| JP | 2007-335464 | 12/2007 |
| JP | 2007335464 A | 12/2007 |
| JP | 200834534 A | 2/2008 |
| JP | 2008166439 A | 7/2008 |
| JP | 2008171938 A | 7/2008 |
| JP | 2008235378 A | 10/2008 |
| JP | 2008251794 A | 10/2008 |
| JP | 2008277362 A | 11/2008 |
| JP | 2008306128 A | 12/2008 |
| JP | 2009004650 A | 1/2009 |
| JP | 2009-508324 A | 2/2009 |
| JP | 2009044110 A | 2/2009 |
| JP | 2009506553 A | 2/2009 |
| JP | 2009064966 A | 3/2009 |
| JP | 2009088254 A | 4/2009 |
| JP | 2009111384 A | 5/2009 |
| JP | 2009528706 A | 8/2009 |
| JP | 2009260132 A | 11/2009 |
| JP | 2010103129 A | 5/2010 |
| JP | 2010135671 A | 6/2010 |
| JP | 2010192928 A | 9/2010 |
| JP | 2010199528 A | 9/2010 |
| JP | 2010206007 A | 9/2010 |
| JP | 2011514015 A | 4/2011 |
| JP | 2011166051 A | 8/2011 |
| KR | 100265563 | 9/2000 |
| KR | 20010061849 A | 7/2001 |
| KR | 2001 0094894 A | 11/2001 |
| KR | 10-0393102 | 7/2002 |
| KR | 20020058216 A | 7/2002 |
| KR | 20060064291 A | 6/2006 |
| KR | 20070058680 A | 6/2007 |
| KR | 20080020069 A | 3/2008 |
| KR | 100865125 B1 | 10/2008 |
| KR | 20080094251 A | 10/2008 |
| KR | 100886100 B1 | 2/2009 |
| KR | 20090033605 A | 4/2009 |
| KR | 20090123680 A | 12/2009 |
| KR | 20100033012 A | 3/2010 |
| KR | 20100062315 A | 6/2010 |
| KR | 101011863 B1 | 1/2011 |
| KR | 20120075855 A | 7/2012 |
| KR | 101215271 B1 | 12/2012 |
| KR | 20130048810 A | 5/2013 |
| KR | 20150012285 A | 2/2015 |
| TW | 200539406 A | 12/2005 |
| TW | 200721327 A | 6/2007 |
| TW | 200810079 A | 2/2008 |
| TW | 200849551 A | 12/2008 |
| TW | 200933760 A | 8/2009 |
| TW | 201023277 A | 6/2010 |
| TW | 201250979 A | 12/2012 |
| TW | I605558 B | 11/2017 |
| WO | 9615458 A1 | 5/1996 |
| WO | 02/13256 A1 | 2/2002 |
| WO | 03045123 A1 | 3/2003 |
| WO | 2004077525 A2 | 9/2004 |
| WO | 2006050691 A2 | 5/2006 |
| WO | 2007083351 A1 | 7/2007 |
| WO | 2007101251 A2 | 9/2007 |
| WO | 2007116544 A1 | 10/2007 |
| WO | 2008065896 A1 | 6/2008 |
| WO | 2008120755 A1 | 10/2008 |
| WO | 2009096950 A1 | 8/2009 |
| WO | 2009158098 A2 | 12/2009 |
| WO | 2010014103 A1 | 2/2010 |
| WO | 2010041630 A1 | 4/2010 |
| WO | 2010101163 A1 | 9/2010 |
| WO | 2012067177 A1 | 5/2012 |
| WO | 2013059181 A1 | 4/2013 |
| WO | 2013065895 A1 | 5/2013 |
| WO | 2014107301 A1 | 7/2014 |

OTHER PUBLICATIONS

Brochure, "Invensas BVA PoP for Mobile Computing: 100+ GB/s BVA PoP," Invensas Corporation, c. 2012, 2 pages.
Brochure, "Invensas BVA PoP for Mobile Computing: Ultra High IO Without TSVs," Invensas Corporation, Jun. 26, 2012, 4 pages.
Campos et al., "System in Package Solutions Using Fan-Out Wafer Level Packaging Technology," SEMI Networking Day, Jun. 27, 2013, 31 pages.
Ghaffarian Ph.D., Reza et al., "Evaluation Methodology Guidance for Stack Packages," Jet Propulsion Laboratory, California Institute of Technology, Pasadena, CA, NASA, Oct. 2009, 44 pages.
IBM et al., "Method of Producing Thin-Film Wirings with Vias," IBM Technical Disclosure Bulletin, Apr. 1, 1989, IBM Corp., (Thornwood), US-ISSN 0018-8689, vol. 31, No. 11, pp. 209-210, https://priorart.ip.com.
International Search Report for Application No. PCT/US2015/032679, dated Nov. 11, 2015, 2 pages.
International Search Report for Application No. PCT/US2016/056402, dated Jan. 31, 2017, 3 pages.
International Search Report for Application No. PCT/US2016/056526, dated Jan. 20, 2017, 3 pages.
International Search Report for Application No. PCT/US2016/068297, dated Apr. 17, 2017, 3 pages.
NTK HTCC Package General Design Guide, Communication Media Components Group, NGK Spark Plug Co., Ltd., Komaki, Aichi, Japan, Apr. 2010, 32 pages.

(56) References Cited

OTHER PUBLICATIONS

Partial International Search Report for Application No. PCT/US2015/032679, dated Sep. 4, 2015, 2 pages.
Taiwanese Office Action for Application No. 103103350 dated Mar. 21, 2016.
Yoon, PhD, Seung Wook, "Next Generation Wafer Level Packaging Solution for 3D integration," May 2010, Stats ChipPAC Ltd.
U.S. Appl. No. 13/477,532, filed May 22, 2012.
International Search Report and Written Opinion for Application No. PCT/US2014/050125 dated Feb. 4, 2015.
Written Opinion for Application No. PCT/US2014/050125 dated Jul. 15, 2015.
"EE Times Asia" [online]. [Retrieved Aug. 5, 2010]. Retrieved from internet. <http://www.eetasia.com/ART_8800428222_480300_nt_dec.52276.HTM>, 4 pages.
"Wafer Level Stack—WDoD", [online]. [Retrieved Aug. 5, 2010]. Retrieved from the Internet. <http://www.3d-plus.com/techno-wafer-level-stack-wdod.php>, 2 pages.
Bang, U.S. Appl. No. 10/656,534, filed Sep. 5, 2003.
Chinese Office Action for Application No. 201180022247.8 dated Apr. 14, 2015.
Chinese Office Action for Application No. 201180022247.8 dated Sep. 16, 2014.
Chinese Office Action for Application No. 201310264264.3 dated May 12, 2015.
Extended European Search Report for Application No. EP13162975 dated Sep. 5, 2013.
International Preliminary Report on Patentability, Chapter II, for Application No. PCT/US2014/055695 dated Dec. 15, 2015.
International Search Report and Written Opinion for Application No. PCT/US2011/024143 dated Jan. 17, 2012.
International Search Report and Written Opinion for Application No. PCT/US2011/044346 dated May 11, 2012.
International Search Report and Written Opinion for Application No. PCT/US2012/060402 dated Apr. 2, 2013.
International Search Report and Written Opinion for Application No. PCT/US2013/026126 dated Jul. 25, 2013.
International Search Report and Written Opinion for Application No. PCT/US2013/041981 dated Nov. 13, 2013.
International Search Report and Written Opinion for Application No. PCT/US2013/052883 dated Oct. 21, 2013.
International Search Report and Written Opinion for Application No. PCT/US2013/053437 dated Nov. 25, 2013.
International Search Report and Written Opinion for Application No. PCT/US2013/075672 dated Apr. 22, 2014.
International Search Report and Written Opinion for Application No. PCT/US2014/014181 dated Jun. 13, 2014.
International Search Report and Written Opinion for Application No. PCT/US2014/050148 dated Feb. 9, 2015.
International Search Report and Written Opinion for Application No. PCT/US2014/055695 dated Mar. 20, 2015.
International Search Report and Written Opinion for Application No. PCT/US2015/011715 dated Apr. 20, 2015.
International Search Report and Written Opinion for PCT/US2011/060551 dated Apr. 18, 2012.
International Search Report and Written Opinion PCT/US2011/044342 dated May 7, 2012.
International Search Report Application No. PCT/US2011/024143, dated Sep. 14, 2011.
International Search Report, PCT/US2005/039716, dated Apr. 5, 2006.
Japanese Office Action for Application No. 2013-509325 dated Oct. 18, 2013.
Japanese Office Action for Application No. 2013-520776 dated Apr. 21, 2015.
Japanese Office Action for Application No. 2013-520777 dated May 22, 2015.
Jin, Yonggang et al., "STM 3D-IC Package and 3D eWLB Development," STMicroelectronics Singapore/STMicroelectronics France May 21, 2010.
Kim et al., "Application of Through Mold Via (TMV) as PoP base package", 6 pages (2008).
Korean Office Action for Application No. 10-2011-0041843 dated Jun. 20, 2011.
Korean Office Action for Application No. 2014-7025992 dated Feb. 5, 2015.
Korean Search Report KR10-2011-0041843 dated Feb. 24, 2011.
Meiser S, "Klein Und Komplex", Elektronik, IRL Press Limited, DE, vol. 41, No. 1, Jan. 7, 1992 Jan. 7, 1992), pp. 72-77, XP000277326. (International Search Report for Application No. PCT/US2012/060402 dated Feb. 21, 2013 provides concise statement of relevance.).
Neo-Manhattan Technology, A Novel HDI Manufacturing Process, "High-Density Interconnects for Advanced Flex Substrates & 3-D Package Stacking,"IPC Flex & Chips Symposium, Tempe, AZ, Feb. 11-12, 2003.
North Corporation, "Processed Intra-layer Interconnection Material for PWBs [Etched Copper Bump with Copper Foil]," NMBITM, Version 2001.6.
Office Action for Taiwan Application No. 100125521 dated Dec. 20, 2013.
Office Action from Taiwan for Application No. 100125522 dated Jan. 27, 2014.
Office Action from U.S. Appl. No. 12/769,930 dated May 5, 2011.
Partial International Search Report for Application No. PCT/US2012/060402 dated Feb. 21, 2013.
Partial International Search Report for Application No. PCT/US2013/026126 dated Jun. 17, 2013.
Partial International Search Report for Application No. PCT/US2013/075672 dated Mar. 12, 2014.
Partial International Search Report for Application No. PCT/US2014/014181 dated May 8, 2014.
Partial International Search Report for Application No. PCT/US2015/033004 dated Sep. 9, 2015.
Partial International Search Report from Invitation to Pay Additional Fees for Application No. PCT/US2012/028738 dated Jun. 6, 2012.
Redistributed Chip Package (RCP) Technology, Freescale Semiconductor, 2005, 6 pages.
Search Report from Korean Patent Applicatin No. 10-2010-0113271 dated Jan. 12, 2011.
Taiwanese Office Action for Application No. 102106326 dated Sep. 18, 2015.
Taiwanese Office Action for Application No. 100140428 dated Jan. 26, 2015.
Taiwanese Office Action for Application No. 100141695 dated Mar. 19, 2014.
Taiwanese Office Action for Application No. 101138311 dated Jun. 27, 2014.
Taiwanese Search Report for Application No. TW105128420 dated Sep. 26, 2017.
Chinese Office Action Search Report for Application No. 2014800551784 dated Jan. 23, 2018, 3 pages.
European Search Results under Rule 164(2)(b) EPC for Application No. 12712792 dated Feb. 27, 2018, 2 pages.
International Seach Report for Application No. PCT/US2017/064437 dated Mar. 29, 2018, 5 pages.

\* cited by examiner

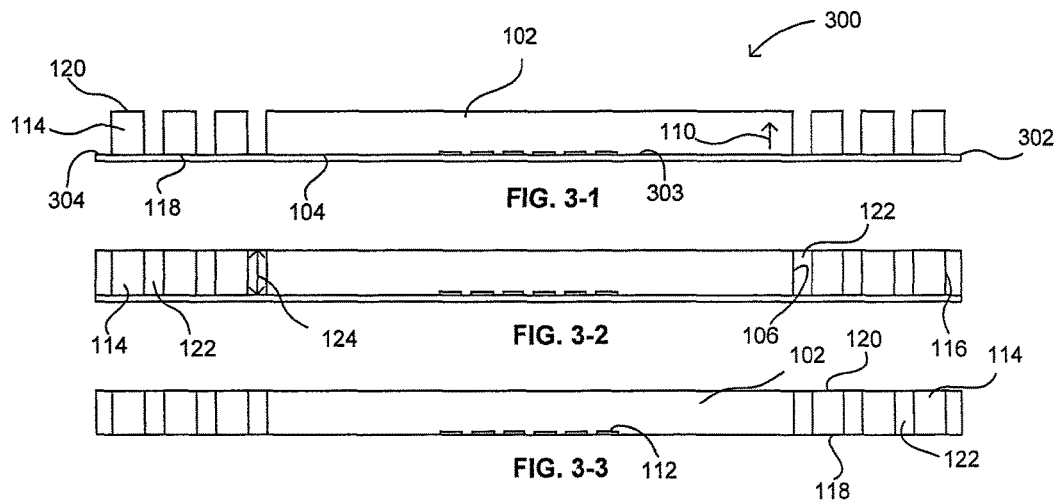
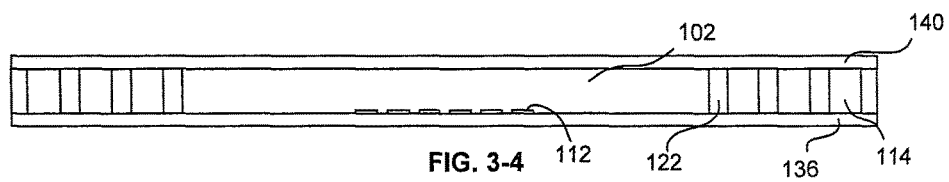
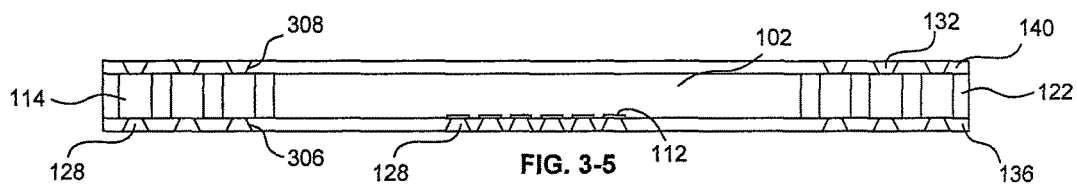
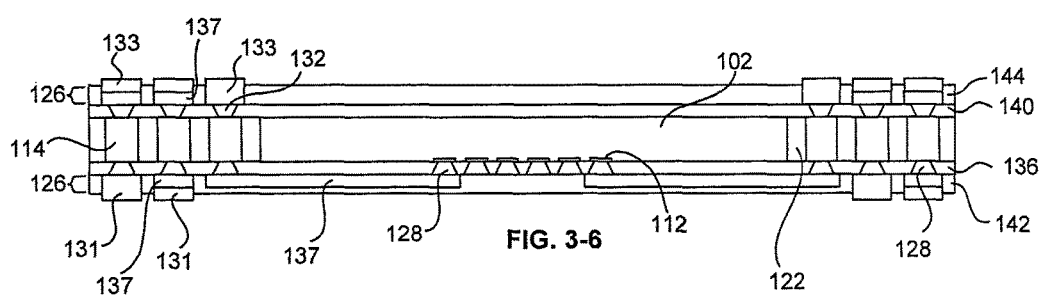

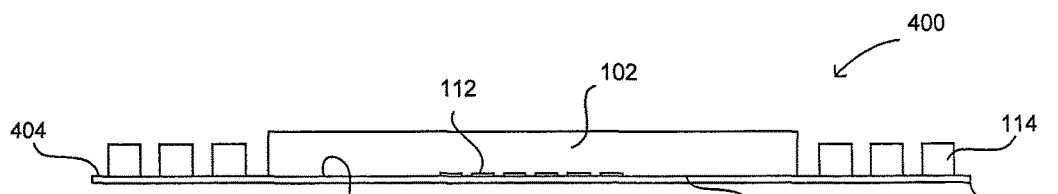
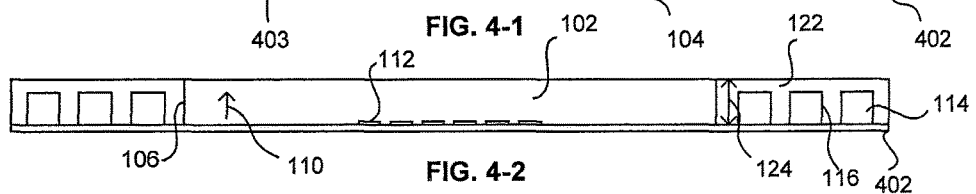
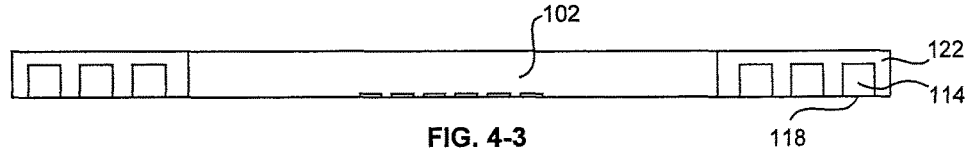
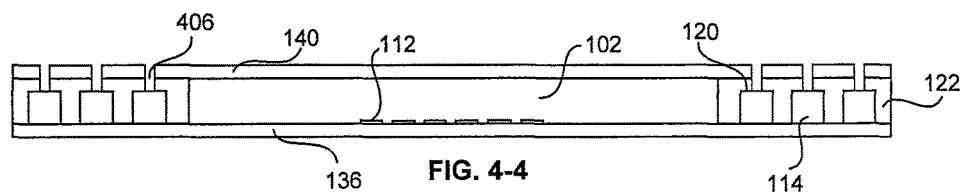
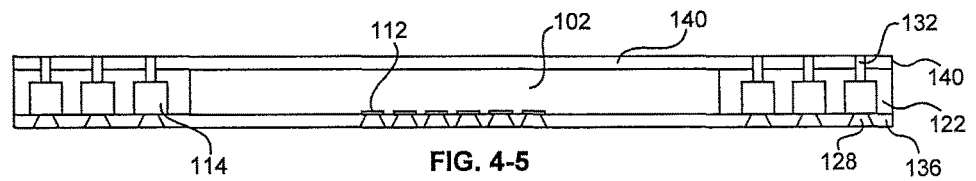
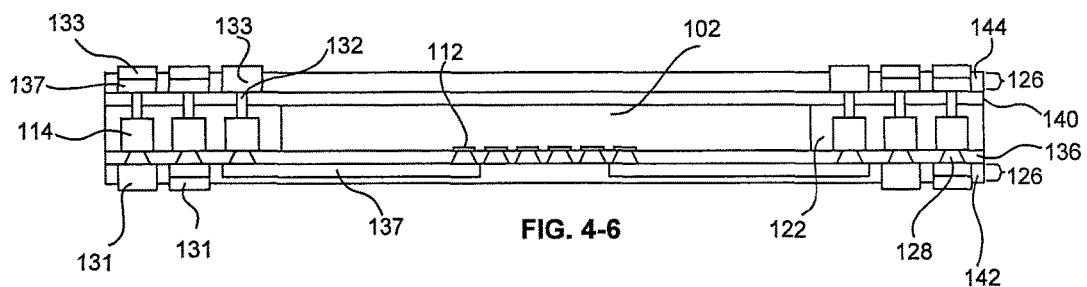

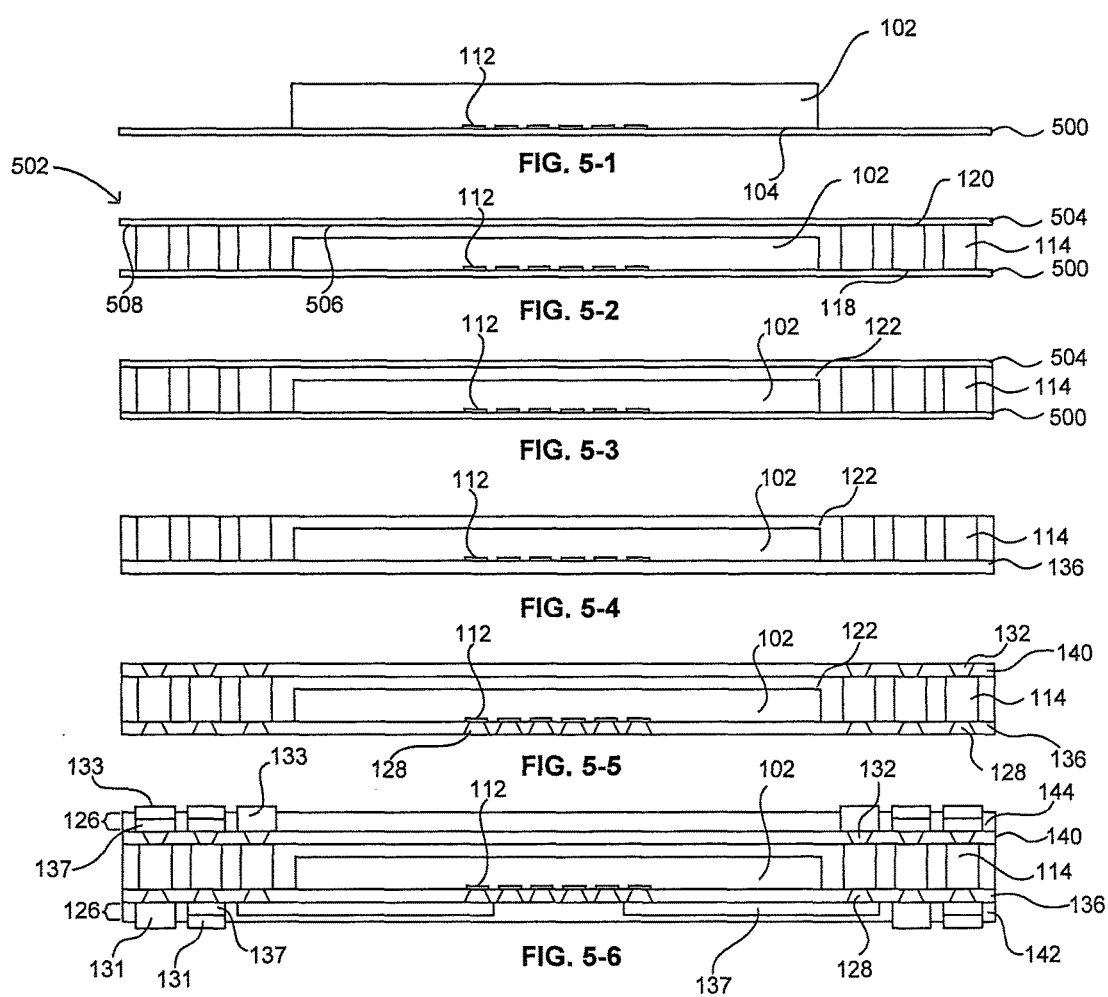

METHOD OF MANUFACTURING EMBEDDED PACKAGING WITH PREFORMED VIAS

CROSS-REFERENCE TO RELATED APPLICATIONS

The present application is a divisional of U.S. patent application Ser. No. 13/961,344, filed Aug. 7, 2013, the disclosure of which is incorporated herein by reference.

FIELD OF THE INVENTION

The present application describes structures such as that which can be incorporated into a microelectronic assembly which may include an unpackaged semiconductor die or packaged semiconductor die, as well as methods for making such structures.

BACKGROUND OF THE INVENTION

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent each edge of the device's front surface, or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically between about 0.005 mm and about 0.8 mm in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

An interposer can be provided as an interconnection element having contacts and top and bottom surfaces thereof electrically connected with one or more packaged or unpackaged semiconductor dies at one of the top or bottom surface thereof, and electrically connected with another component at the other one of the top or bottom surfaces. The other component may in some cases be a package substrate which in turn may be electrically connected with another component which may be or may include a circuit panel.

Despite all of the above-described advances in the art, still further improvements in microelectronics assemblies, the individual components thereof, such as interposers and microelectronics elements, and methods of making the same would be desirable.

BRIEF SUMMARY OF THE INVENTION

Microelectronic assemblies and methods of making the same are disclosed herein. In some embodiments, a microelectronic assembly comprises a microelectronic element having a front surface, edge surfaces bounding the front surface, and a plurality of contacts at the front surface, the microelectronic element having a first thickness extending in a first direction away from the front surface. The microelectronic assembly includes substantially rigid metal posts extending in the first direction, the posts disposed between at least one of the edge surfaces and a corresponding edge of the microelectronic assembly. Each metal post has a sidewall separating first and second end surfaces of such metal post from one another in the first direction, wherein the sidewalls of the metal posts have a root mean square (rms) surface roughness of less than about 1 micron. The microelectronic assembly includes a encapsulation having a second thickness extending in the first direction between first and second surfaces of the encapsulation, the encapsulation contacting at least the edge surfaces of the microelectronic element and the sidewalls of the metal posts, wherein the metal posts extend at least partly through the second thickness, and the encapsulation electrically insulates adjacent metal posts from one another. The microelectronic assembly has first and second sides adjacent the first and second surfaces of the encapsulation, respectively, and having terminals at the first side. The microelectronic assembly includes a insulation layer overlying the first surface of the encapsulation at the first side and having a thickness extending away from the first surface of the encapsulation. The microelectronic assembly includes connection elements extending away from the first end surfaces of the metal posts and through the thickness of the insulation layer. The first connection elements electrically connects at least some of the first end surfaces with corresponding terminals, wherein at least some connection elements have cross sections smaller than cross sections of the metal posts. The microelectronic assembly includes an electrically conductive redistribution structure deposited on the insulation layer. The redistribution structure electrically connects the terminals with corresponding first end surfaces of the metal posts through at least some of the connection elements, wherein at least some of the metal posts are electrically coupled with the contacts of the microelectronic element.

In one embodiment, the metal posts extend from the first surface of the encapsulation to the second surface of the encapsulation.

In one embodiment, the first thickness is one of smaller or equal to the second thickness.

In one embodiment, the microelectronic assembly further comprises second connection elements extend in the first direction of the second thickness of the encapsulation from the second end surfaces of the metal posts to the second surface of the encapsulation.

In one embodiment, the second connection elements have sidewalls having an rms surface roughness of greater than about 1 micron.

In one embodiment, the metal posts extending in the first direction of the second thickness of the encapsulation to at least about 50% of the second thickness.

In one embodiment, at least some of the second connection elements have a cross section smaller than that of the metal posts.

In one embodiment, the microelectronic assembly further comprises second terminals at the second side of the microelectronic assembly. The redistribution structure is deposited on the second side of the microelectronic assembly and electrically connects the second terminals with corresponding second end surfaces of the metal posts through at least one of the second connection elements.

In one embodiment, the microelectronic assembly further comprises second terminals at the second side of the microelectronic assembly. The microelectronic assembly further comprises a second insulation layer overlying the second surface of the encapsulation at the second side of the microelectronic assembly and having thickness extending away from the second surface of the encapsulation. The microelectronic assembly further comprises second connection elements extending away from the second end surfaces of the metal posts and through the thickness of the second insulation layer, the second connection elements electrically connecting at least some of the second end surfaces with corresponding second terminals, wherein at least some second connection elements have cross sections smaller than cross sections of the metal posts.

In one embodiment, the first and second thicknesses are the same.

In one embodiment, the microelectronic assembly further comprises second terminals at the second side of the microelectronic assembly. The redistribution structure includes traces extending in a second direction transverse to the first direction beyond the edge surfaces of the metal posts, wherein at least one of the first terminals are electrically coupled with the first end surfaces through the traces, or the second terminals are electrically coupled with the second end surfaces through the traces.

In one embodiment, the microelectronic assembly comprises a second microelectronic element at least partly overlying the first microelectronic element, wherein the second microelectronic element having a first surface, edge surfaces bounding the first surface, the second microelectronic element having a thickness extending in the first direction away from the first surface of the second microelectronic element, wherein the encapsulation contacts at least the edge surfaces of the second microelectronic element.

In one embodiment, a method of forming a microelectronic assembly comprises forming a structure including a microelectronic element having a front surface, edge surfaces bounding the front surface, and a plurality of contacts at the front surface, and substantially rigid metal posts extending in the first direction. The posts are disposed between at least one of the edge surfaces and a corresponding edge of the microelectronic assembly. Each metal post having a sidewall separating first and second end surfaces of such metal post from one another, the sidewalls of the metal posts having a root mean square (rms) surface roughness of less than about 1 micron. The method includes forming a encapsulation having a second thickness extending in the first direction between first and second surfaces of the encapsulation. The encapsulation contacts at least the edge surfaces of the microelectronic element and the sidewalls of the metal posts, wherein the metal posts extend at least partly through the second thickness, and the encapsulation electrically insulates adjacent metal posts from one another. The method includes depositing an insulation layer overlying the first surface of the encapsulation and having thickness extending away from the first surface of the encapsulation. The method includes forming connection elements extending away from the first end surfaces of the metal posts and through the thickness of the insulation layer, wherein at least some connection elements have cross sections smaller than cross sections of the metal posts. The method includes depositing an electrically conductive redistribution structure on the insulation layer, the redistribution layer electrically connecting at least some metal posts with the contacts of the microelectronic element. The method includes forming terminals at a first side of the microelectronic assembly adjacent to the first surface of the encapsulation, wherein the connection elements electrically connecting at least some first end surfaces with corresponding terminals.

In one embodiment, prior to forming the structure, the metal posts extend in the first direction from a first surface of a conductive layer, the posts disposed between a first portion of the first surface of the conductive layer and a corresponding edge of the conductive layer.

In one embodiment, forming the structure further comprises attaching the front surface of the microelectronic element to the first portion of the first surface of the conductive layer.

In one embodiment, prior to forming the structure, the method further comprises providing a substrate having a thickness extending in the first direction from a first surface to a second surface of the substrate, the substrate having a plurality of rigid elements extending in the first direction at the second surface of the substrate; and depositing a conductive material on the second surface of the substrate and surfaces of the rigid elements to form the metal posts and conductive layer.

In one embodiment, after forming the encapsulation, the method further comprises removing the substrate and the rigid elements to reveal openings in the metal posts, the openings in the metal posts extending in the first direction from the front side of the microelectronic assembly; and filling the openings with additional conductive material prior to depositing the insulation layer.

In one embodiment, after forming the encapsulation and prior to depositing the insulation layer, the method further comprises removing the conductive layer to expose the first end surfaces of the metal posts.

In one embodiment, the method further comprises forming a second insulation layer overlying the second surface of the encapsulation and having thickness extending away from the second surface of the encapsulation; forming second connection elements extending away from the second end surfaces of the metal posts and through the thickness of the second insulation layer, wherein at least some second connection elements have cross sections smaller than cross sections of the metal posts; depositing the redistribution structure on the second insulation layer; and forming second terminals at the second side of the microelectronic assembly adjacent to the second surface of the encapsulation, wherein the second terminals are overlying the redistribution structure, wherein the second connection elements electrically connecting at least some second end surfaces with corresponding second terminals through the redistribution structure.

In one embodiment, the method further comprises forming openings extending between at least some second end surfaces of metal posts and the second surface of the encapsulation, the openings exposing at least portions of second end surfaces of the metal posts; and forming second connection elements extending through the openings in the encapsulation and electrically connected to at least some metal posts at the second end surfaces.

In one embodiment, prior to forming the structure, the front surface of the microelectronic element is attached to a carrier.

In one embodiment, forming the structure further comprises attaching the carrier to the metal posts such that the microelectronic element is juxtaposed with the first portion of the first surface of the conductive layer.

In one embodiment, the microelectronic element and the first portion of the first surface of the conductive layer are separated therefrom.

In one embodiment, after forming the encapsulation, the method further comprises removing the carrier to expose the front surface of the microelectronic element and the second end surfaces of the metal posts; and removing the conductive layer to expose the first end surfaces of the metal posts.

BRIEF DESCRIPTION OF THE DRAWINGS

FIG. 1-2 depicts a side schematic view of a microelectronic assembly in accordance with some embodiments of the invention.

FIG. 1-3 depicts a side schematic view of a microelectronic assembly in accordance with some embodiments of the invention.

FIG. 1-4 depicts a side schematic view of a microelectronic assembly in accordance with some embodiments of the invention.

FIG. 1-5 depicts a top down cross sectional view of a microelectronic assembly in accordance with some embodiments of the invention.

FIG. 1-6 depicts a partial top down schematic view of a microelectronic assembly in accordance with some embodiments of the invention.

FIG. 1-7 depicts a side schematic view of a plurality of microelectronics assemblies in a stacked structure in accordance with some embodiments of the invention.

FIG. 1-8 depicts a partial top down schematic view of a microelectronic assembly in accordance with some embodiments of the invention.

FIG. 1-9 depicts a partial top down schematic view of a microelectronic assembly in accordance with some embodiments of the invention.

FIG. 1-10 depicts a partial top down schematic view of a microelectronic assembly in accordance with some embodiments of the invention.

FIG. 2 depicts a flow chart for a method of forming a microelectronic assembly in accordance with some embodiments of the invention.

FIGS. 3-1 through 3-6 depict stages in a method of fabricating a microelectronic assembly in accordance with some embodiments of the invention.

FIGS. 4-1 through 4-6 depict stages in a method of fabricating a microelectronic assembly in accordance with some embodiments of the invention.

FIGS. 5-1 through 5-6 depict stages in a method of fabricating a microelectronic assembly in accordance with some embodiments of the invention.

FIGS. 6-1 through 6-5 depict stages in a method of fabricating a microelectronic assembly in accordance with some embodiments of the invention.

DETAILED DESCRIPTION

The present invention will be described in more detail below.

All ranges recited herein include the endpoints, including those that recite a range "between" two values. Terms such as "about," "generally," "substantially," and the like are to be construed as modifying a term or value such that it is not an absolute, but does not read on the prior art. Such terms will be defined by the circumstances and the terms that they modify as those terms are understood by those of skill in the art. This includes, at very least, the degree of expected experimental error, technique error and instrument error for a given technique used to measure a value.

It should be further understood that a description in range format is merely for convenience and brevity and should not be construed as an inflexible limitation on the scope of the invention. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 2.3, 3, 4, 5, 5.7 and 6. This applies regardless of the breadth of the range.

As used in this disclosure with reference to a component, a statement that an element, e.g., a conductive element, contact, metal post, terminal, structure, or other element, is "at" a surface of a component, e.g., microelectronic element, interposer, circuit panel, or other substrate, indicates that, when the component is not assembled with any other element, the element is available for contact with a theoretical point moving in a direction perpendicular to the surface of the component toward the surface of the component from outside the component. Thus, an element which is at a surface of a component may project from such surface; may be flush with such surface; or may be recessed relative to such surface in a hole or depression in the component.

Figure 1:
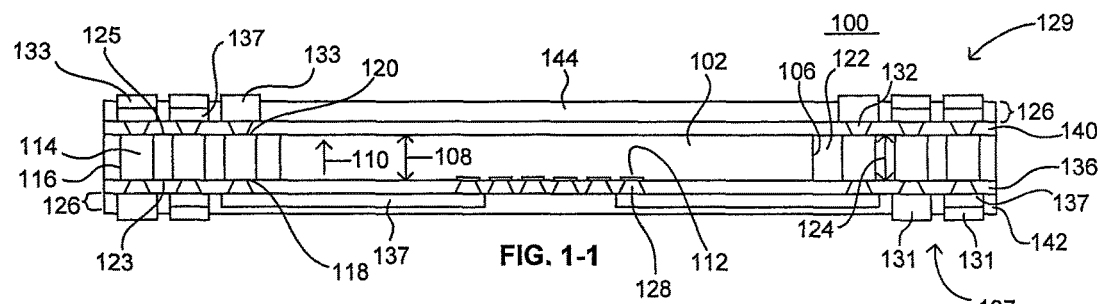
FIG. 1-1 depicts a side schematic view of a microelectronic assembly in accordance with some embodiments of the invention.
Figures 1, 2:
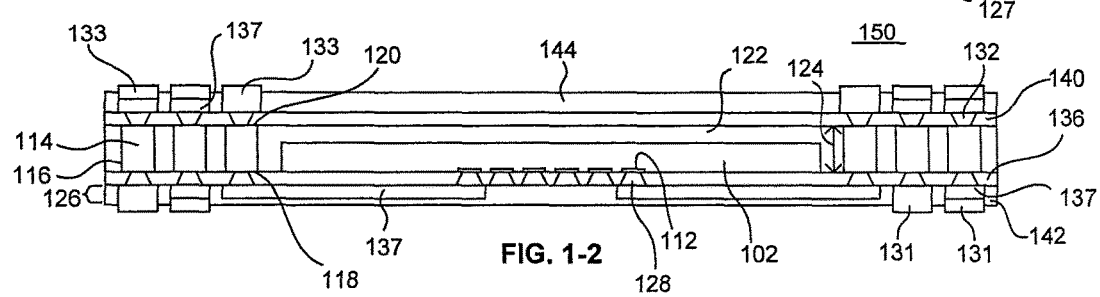
Figures 1, 2, 3:
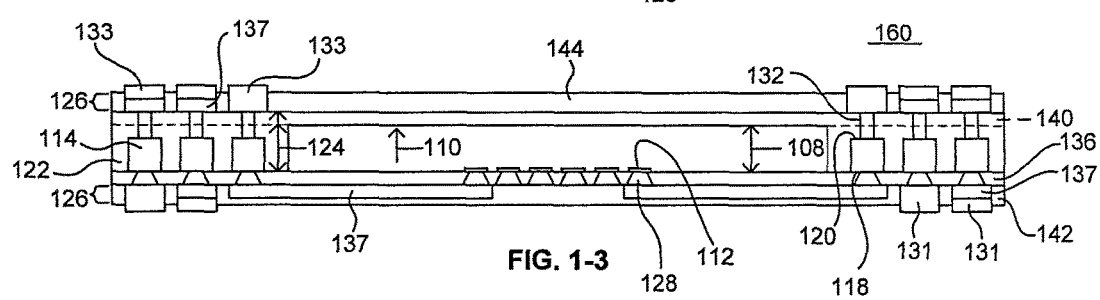

FIGS. 1-1 through 1-3 depict microelectronic assemblies in accordance with some embodiments of the invention. The various embodiments of the microelectronic assemblies disclosed herein may be utilized alone, or combination.

FIG. 1-1 depicts a side schematic view of a microelectronic assembly 100 in accordance with some embodiments of the invention. The microelectronic assembly 100 includes a microelectronic element 102. The microelectronic element 102 may have a front surface 104 and edge surfaces 106 bounding the front surface 104. A first thickness 108 of the microelectronic element 102 can extend in a first direction 110 away from the front surface 104. The microelectronic element can include a plurality of contacts 112 at the front surface 104. Exemplary microelectronic elements 102 can include any one or more of a semiconductor die, packaged semiconductor chip, or the like.

The microelectronic assembly 100 includes a plurality of substantially rigid metal posts 114 disposed between at least one of the edge surfaces 106 and a corresponding edge of the microelectronic assembly 100. One exemplary top down schematic view of the microelectronic assembly 100 having the microelectronic element 102 and metal posts 114 is depicted in FIG. 1-5.

Each metal post 114 includes a sidewall 116 separating first and second end surfaces 118, 120 from one another in the first direction 110. The sidewalls 116 of the metal posts 114 can have a root mean square (rms) surface roughness of less than about 1 microns. Such a low surface roughness of the sidewalls 116 may be achieved using methods disclosed herein and discussed below. In one embodiment, the metal posts can be greater than about 99% cylindrical. For example, low surface roughness, shape, and other features of the metal posts can be formed by methods discussed herein. The metal posts 114 may include one or more metals selected from copper (Cu), nickel (Ni), gold (Au), or alloys thereof. The microelectronic element 100 includes a encapsulation 122 having a second thickness 124 extending in the first direction 110 between first and second surfaces 123, 125 of the encapsulation 122. The encapsulation 122 contacts at least the edge surfaces 106 of the microelectronic element 102 and the sidewalls 116 of the plurality of metal posts 114. In one embodiment, such as depicted in FIG. 1-1, the second thickness 124 of encapsulation 122 is about equal to the first thickness 108 of the microelectronic element 102. The encapsulation 122 can be formed by molding an encapsulant material, e.g., a potting compound. In a particular example, the encapsulation 122 can be particulate composite layer which includes a polymeric matrix and particulate loading within the polymeric matrix. Such composite layer can be formed, for example by depositing an uncured polymeric material which has the particulate loading material therein, the particulate loading material optionally being a dielectric material having a low coefficient of thermal expansion ("CTE").

The metal posts 114 extend at least partially through the encapsulation 122. In one embodiment, such as depicted in FIGS. 1-1, the metal posts 114 extending entirely through the second thickness 124 of the encapsulation 122 from a first side 127 to a second side 129 of the microelectronic assembly 100. The first and second sides 127, 129 may be adjacent to the first and second surfaces 123, 125, respectively, of the encapsulation 122.

The microelectronic assembly 100 can have terminals 131 at the first side 127 of the microelectronic assembly. In some embodiments, the microelectronic assembly can have second terminals 133 at the second side 129 of the microelectronic assembly. The terminals 131, 133 can provide surfaces form electrically coupling the microelectronic assembly 100 to other components, such as another microelectronic assembly, an interposer, a printed circuit board (PCB), or other such components, the components adjacent to the first and second sides 127, 129, respectively of the microelectronic assembly. In one exemplary embodiment, the microelectronic assembly can be included in a vertically stacked structure as depicted in FIG. 1-7. For example, another microelectronic assembly can be stacked adjacent to the second side 129 and overlying the microelectronic assembly, and a the microelectronic assembly in turn can be stacked at the first side 127 thereof to overlie a circuit panel 135, or another component, such as an interposer. Many vertical stacking arrangements and components are possible, and not limited to the exemplary embodiment depicted in FIG. 1-7.

The microelectronic assembly 100 may include an insulation layer 136 at the first side 127 of the microelectronic assembly 100. In one exemplary embodiment, the insulation layer comprises a dielectric material. The insulation layer 136 overlies the front surface 104 of the microelectronic element 102 and the first end surfaces 118 of the metal posts 114. Connection elements 128 can extend away from the first end surfaces 118 and through the thickness of the insulation layer 136 to electrically connect with the first end surfaces 118 and contacts 112. The connection elements 128 can connect at least some of the first end surfaces 118 with corresponding terminals 131. As depicted in FIGS. 1-1 through 1-4, the terminals 131 may be coupled to the first connection elements through a redistribution structure 126. However, in some embodiments, the terminals 131 may overlie the insulation layer 136. In other embodiments, the terminals 131 may be formed in the insulation layer 136, or alternatively in another insulation layer overlying the insulation layer 136. The insulation layer 136 can include one or more of a polymeric material, such as polyimide, polyamide, or a photoimageable material, which in some instances can be benzocyclobutane (BCB).

The microelectronic assembly 100 may include a second insulation layer 140 at the second side 129 of the microelectronic assembly 100. The second insulation layer 140 can include any embodiments and/or permutations as described for the insulation layer 136. Second connection elements 132 can extend away from the second end surfaces 120 and through the thickness of the second insulation layer 140 to electrically connect with the second end surfaces 120. The second connection elements 132 can connect at least some of the second end surfaces 120 with corresponding second terminals 133. The second connection elements can include any embodiments and/or permutations as described for the connection elements 128.

At least some of the connection elements 128, 132 can have a cross section that is smaller than that of the metal posts 114 at the first and second ends surfaces 118, 120, respectively. In some instances, the smaller cross section of the connection elements 128, 132 can improve alignment with the metal posts 114. Improved alignment can result in improved routing. The connection elements 128, 132 can have sidewalls that have rms surface roughness that is greater than that of the sidewalls 116 of the metal posts 114. In one embodiment, the sidewalls of the connection elements 128, 132 have a rms surface roughness greater than about 1 micron. The connection elements 128, 132 can be formed from any suitable materials, such as those materials discussed above for the metal posts 114, or other materials. The compositions of a metal post 114 and corresponding connection elements 128, 132 can be the same or different.

The microelectronic assembly 100 includes an electrically conductive redistribution structure 126 deposited onto at least one of the insulation layers 136, 140. For example, in some embodiments, such as depicted a FIGS. 1-1 through 1-3 the redistribution structure can be deposited on both the insulation layers 136, 140. Alternatively, in one exemplary embodiment depicted in FIG. 1-4, the redistribution structure 126 is deposited on the insulation layer 136, but there is no redistribution structure and/or second insulation layer 140 deposited onto the second end surfaces 120. In such embodiments, the second end surfaces 120 may serve as the second terminal 133. In some embodiments, the redistribution structure 126 is integral with one and/or both insulation layers 136, 140 and corresponding one and/or both connection elements 128, 132.

The redistribution structure 126 includes at least one of a portion of at least one terminal 131 disposed beyond the edge surface of the metal post 114 with which such terminal 131 is coupled, or a portion of at least one second terminal 133 disposed beyond the edge surface of the metal post 114 with which such second terminal 133 is coupled. In exemplary embodiments, as depicted in top down view in FIG. 1-6, the redistribution structure can includes traces 137 extending in a second direction transverse to the first direction 110 beyond the edge surfaces of the metal posts 114. At least one of the terminals 131 can be electrically coupled with the first end surfaces 118 through the traces 131. Similarly, at least one of the second terminals 133 can be electrically coupled with the second end surfaces 120 through the traces 137. In other embodiments, such as depicted in FIGS. 1-1 through 1-4 at the first side 127 of the microelectronic assembly, at least some traces 137 can electrically couple contacts 112 of the microelectronic element 102 to the metal posts 114. In other embodiments, such as depicted in FIG. 1-6, one and/or both terminals 113, 133 can be an integral structure that includes aspects of traces in that it extends beyond the edge surfaces of the metal posts 114 as depicted in the right hand side of FIG. 1-6.

FIG. 1-2 depicts a side schematic view of a microelectronic assembly 150 in accordance with some embodiments of the invention. The microelectronic assembly 150 can include any embodiments and/or permutations as described for the microelectronic assembly 100, except where otherwise noted. In one embodiment of the invention, as shown in the microelectronic assembly 150, the second thickness 124 of the encapsulation 122 can exceed the first thickness 108 of the microelectronic element 102.

FIG. 1-3 depicts a side schematic view of a microelectronic assembly 160 in accordance with some embodiments of the invention. The microelectronic assembly 160 can include any embodiments and/or permutations as described for the microelectronic assembly 100, except where otherwise noted. In one embodiment of the invention, as shown in the microelectronic assembly 160, the metal posts 114 partially extend in the first direction 110 through the second thickness 124. In one embodiment, the metal posts extend in the first direction 110 of the second thickness 124 to at least about 50% of the second thickness 124. In one embodiment, the second connection elements 132 can extend in the first direction of the second thickness 124 of the encapsulation 122 from the second end surfaces 120 of the metal posts 114 as depicted in FIG. 1-3. Though depicted as having a smaller cross section than that of the metal posts 114 at the second end surfaces 120, in some embodiments, the second connection elements 132 can have a larger cross section than that of the metal posts 114. Optionally, the second dielectric layer 140 can be omitted from the microelectronic assembly 160.

FIG. 1-4 depicts a side schematic view of a microelectronic assembly 170 in accordance with some embodiments of the invention. The microelectronic assembly 170 can include any embodiments and/or permutations as described for the microelectronic assembly 100, except where otherwise noted. As depicted in FIG. 1-4, the microelectronic assembly 170 does not include the redistribution structure 126 deposited onto the second end surfaces 120.

FIG. 1-8 depicts a side schematic view of a microelectronic assembly 180 in accordance with some embodiments of the invention. The microelectronic assembly 180 can include any embodiments and/or permutations as described for the microelectronic assembly 100, except where otherwise noted. As depicted in FIG. 1-8, the microelectronic assembly 180 includes a second microelectronic element 182. In some embodiments, the second microelectronic element 182 is at least partially overlying the microelectronic element 102. In one example, as depicted in FIG. 1-8, the second microelectronic element completely overlies the microelectronic element 102. The second microelectronic element 182 can include a first surface 181, and edge surfaces 183 bounding the first surface 181. The second microelectronic element 182 can have a thickness extending in the first direction away from the first surface 181 of the second microelectronic element 182 towards a second surface 184 of the second microelectronic element 182. The microelectronic element 182 can have contacts 185 at the second surface 184. At least some of the metal posts 114 can be electrically coupled with the contacts 185 of the second microelectronic element 182. In one example, the contacts 185 can be electrically coupled with the metal posts 114 through the second connection elements 132 and traces 137.

FIG. 1-9 depicts a side schematic view of a microelectronic assembly 190 in accordance with some embodiments of the invention. The microelectronic assembly 190 can include any embodiments and/or permutations as described for the microelectronic assembly 160, except where otherwise noted. As depicted in FIG. 1-9, the microelectronic assembly 190 includes the second microelectronic element 182.

FIG. 1-10 depicts a side schematic view of a microelectronic assembly 192 in accordance with some embodiments of the invention. The microelectronic assembly 192 can include any embodiments and/or permutations as described for the microelectronic assembly 100, except where otherwise noted. As depicted in FIG. 1-10, the redistribution layer 126 can, optionally, be absent above the second insulation layer 140. A second microelectronic element 193 overlies the second insulation layer 140. The second microelectronic element 193 having a first surface 194, and edge surfaces 195 bounding the first surface 194. The second microelectronic element 193 having a thickness extending in the first direction and away from the first surface 194. The microelectronic element 193 can have contacts 196 at the first surface 194. In one example, the contacts 196 can be directly coupled to the second connection elements 132. In another example, where the redistribution layer 126 is disposed between the insulation layer 140 and the second microelectronic element 193, the contacts 196 can be electrically coupled to at least some of the second connection elements 132 through the redistribution layer 126. The encapsulation 122 can contact at least the edge surfaces 195 of the second microelectronic element 193. In one example, the encapsulation 122 can surround the second microelectronic element 193.

FIG. 2 depicts a flow chart of a method 200 for fabrication of a microelectronic assembly in accordance with some embodiments of the present invention. The method 200 is described below in accordance with stages of fabricating the microelectronic assemblies 100, 160, and 150 respectively depicted in FIGS. 3-1 through 3-6, FIGS. 4-1 through 4-6, and FIGS. 5-1 through 5-6. However, the method 200 may be applied to other embodiments of the present invention, or other microelectronic assemblies within the scope of the invention.

FIG. 3-1 depicts a structure 300 having the microelectronic element 102 and the metal posts 114. The structure 300, as depicted in FIG. 3-1, may include the microelectronic element 102 and the metal posts 114 supported at the front surface 104 and first end surfaces 118, respectively, by a conductive layer 302. At 202, the structure 300 can be formed by attaching the front surface 104 of the microelectronic element 102 to a first portion 303 of a first surface 304 of the conductive layer 302. The metal posts 114 are disposed between the first portion 303 of the first surface 304 and a corresponding edge of the conductive layer 302.

Prior to attachment of the microelectronic element 102 to the conductive layer 302, the metal posts 114 may be pre-formed on the first surface 304 of the conductive layer 302. For example, metal can be plated into openings in a patterned photoresist, the photoresist overlying the conductive layer 302, to form the metal posts 114. Other suitable methods for forming metal posts may be employed including, e.g., sputtering, sintering, other physical or chemically enhanced deposition processes.

At 204, the encapsulation 122 can be formed. The encapsulation 122 can be formed by molding. Optionally, after molding the encapsulation 122, the encapsulation 122 can be thinned to achieve the desired second thickness 124. As depicted in FIG. 3-2, the encapsulation 122 can contact at least the edge surfaces 106 of the microelectronic element 102 and the sidewalls 116 of the metal posts 114. In embodiments of the microelectronic assembly 100, the first thickness 108 of the microelectronic element 102 and the second thickness 124 of the encapsulation region 122 are the same.

After formation of the encapsulation 122, the conductive layer 302 can be removed to expose the first end surfaces 118 of the metal posts 114. The structure 300 is depicted after removed of the conductive layer 302 in FIG. 3-3. The conductive layer 302 can be removed by any suitable process, such as etching, polishing, or combinations thereof.

Figures 1, 2, 3, 4:
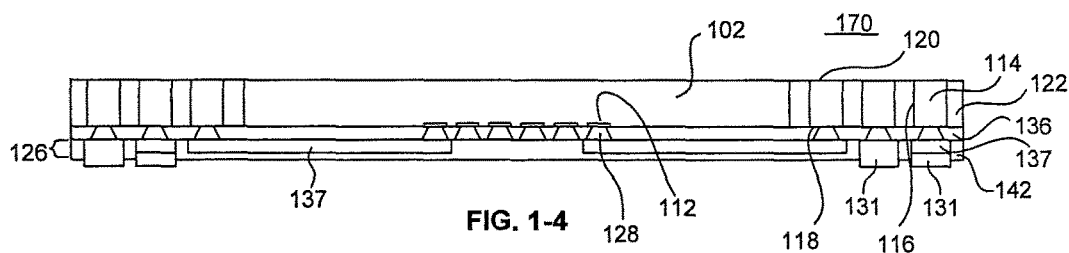

At 206, the insulation layer 136 and the connection elements 128 can be formed at the first side 127 of the microelectronic assembly 100 as depicted in FIGS. 3-3 through 3-4. The insulation layer 136 can be formed overlying the front surface of the microelectronic element 102 and the first end surfaces 118 of the metal posts 114. Openings 306 can be formed, the openings 306 extending in the first direction 110 of thickness of the insulation layer 136 and exposing at least portions of the first end surfaces 118 of the metal posts 114 and contacts 112 of the microelectronic element 102. The openings 306 can be formed by optical lithography followed by removal of materials of the insulation layer 136 to expose portions of the first end surfaces 118 and contacts 112. Alternatively, the openings 306 can be formed by laser or mechanical drilling. The openings 306 can have rough sidewall surfaces, which can contribute to the connection elements 128 having an rms surface roughness of greater than about 1 micron. The connection elements 128 can be formed in the openings 306 by plating, physical vapor deposition (PVD), chemical vapor deposition (CVD) or the like.

Similarly, the second insulation layer 140 can be formed overlying the microelectronic element 102 and the second end surfaces 120 of the metal posts 114. Openings 308 can be formed, the openings 308 extending in the first direction 110 of thickness of the second insulation layer 140 and exposing at least portions of the second end surfaces 120 of the metal posts 114. The openings 308 include any embodiments and/or permutations and/or methods of fabrication as described for the openings 308. The second connection elements 132 can be formed in the openings 308 by plating, physical vapor deposition (PVD), chemical vapor deposition (CVD) or the like.

At 208, the redistribution structure 126 is deposited. As depicted in FIGS. 3-6, the redistribution structure 126 is overlying the insulation layers 136, 140. The redistribution structure 126 can include one or more insulation layers 142, 144 respectively overlying the insulation layers 136, 140. The one or more insulation layers 142, 144 can be patterned to expose at least portions of surfaces of the connection elements 128, 132. The terminals 131, 133 can be electrically coupled to the surfaces of the connection elements 128, 132. The terminals 131, 133 can be formed by any suitable method, such as plating or the like.

Though described above as being sequentially fabricated on the first side 130 and second side 134 of the microelectronic assembly 100, the redistribution structure 126 can be fabricated by any suitable order of process steps. For example, the insulation layers 136, 140 may be formed, followed by the openings 306, 308, followed by the first and second connection elements 128, 132, or other desired ordering of the process steps.

FIGS. 4-1 through 4-6 depict stages in a method of fabricating the microelectronic assembly 160 in accordance with some embodiments of the invention. Some aspects of fabricating the microelectronic assembly 160 are similar to those discussed above in regards to fabrication of the microelectronic assembly 100.

FIG. 4-1 depicts a structure 400 having the microelectronic element 102 and the metal posts 114. The structure 400, as depicted in FIG. 4-1, may include the microelectronic element 102 and the metal posts 114 supported at the front surface 104 and first end surfaces 118, respectively, by a conductive layer 402. At 202, the structure 400 can be formed by attaching the front surface 104 of the microelectronic element 102 to a first portion 403 of a first surface 404 of the conductive layer 402. The metal posts 114 are disposed between the first portion 403 of the first surface 404 and a corresponding edge of the conductive layer 402.

Prior to attachment of the microelectronic element 102 to the conductive layer 402, the metal posts 114 may be pre-formed on the first surface 404 of the conductive layer 402. The pre-forming of the metal posts 114 on the conductive layer 402 can include any embodiments and/or permutations and/or methods of fabrication as described for the pre-forming of the metal posts 114 on the conductive layer 302.

At 204, the encapsulation 122 can be formed. The encapsulation 122 can be formed by molding. Optionally, after molding the encapsulation 122, the encapsulation 122 can be thinned to achieve the desired second thickness 124. As depicted in FIG. 4-2, the encapsulation 122 can contact at least the edge surfaces 106 of the microelectronic element 102 and the sidewalls 116 of the metal posts 114. In embodiments of the microelectronic assembly 160, the metal posts 114 extend in the first direction 110 of the second thickness 124 up to about 50% of the second thickness 124.

After formation of the encapsulation 122, the conductive layer 402 can be removed to expose the first end surfaces 118 of the metal posts 114. The structure 400 is depicted after removed of the conductive layer 402 in FIG. 4-3. The conductive layer 402 can be removed by any suitable process, such as etching, polishing, or combinations thereof.

At 206, the insulation layer 136 and the connection elements 128 can be formed at the first side 127 of the microelectronic assembly 160 as depicted in FIGS. 4-3 through 4-4 in some aspects of the invention. The formation of the insulation layer 136 and connection elements 128 can include any embodiments and/or permutations and/or methods of fabrication as described for the fabrication of those elements in the microelectronic assembly 100.

Optionally, the second insulation layer 140 can be formed overlying the microelectronic element 102 and the second end surfaces 120 of the metal posts 114. Openings 406 can be formed, the openings 406 extending in the first direction 110 of thickness of the encapsulation 122, and optionally the second insulation layer 140 when present. The openings 406 expose at least portions of the second end surfaces 120 of the metal posts 114. The openings 406 can be formed by optical lithography followed by removal of materials of the encapsulation 122, and optionally the second insulation layer 140 when present, to expose portions of the second end surfaces 120 of the metal posts 114. Alternatively, the openings 406 can be formed by laser or mechanical drilling. The openings 406 can have rough sidewall surfaces, which can contribute to the second connection elements 132 having an rms surface roughness of greater than about 1 micron. The second connection elements 132 can be formed in the openings 406 by plating, physical vapor deposition (PVD), chemical vapor deposition (CVD) or the like.

Figures 1, 2, 3, 4, 5:
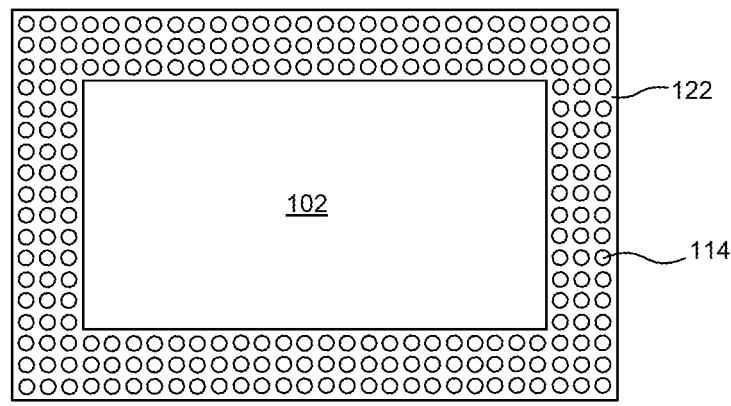
Figures 1, 2, 3, 4, 5, 6:
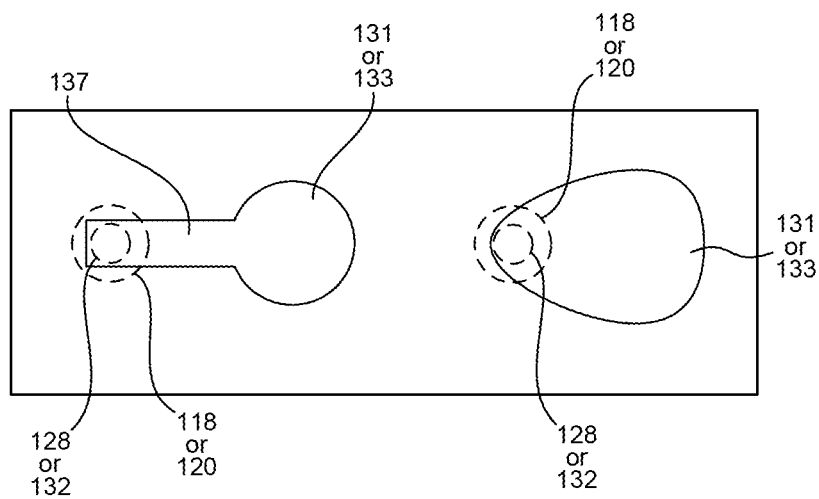
Figures 1, 2, 3, 4, 5, 6, 7:
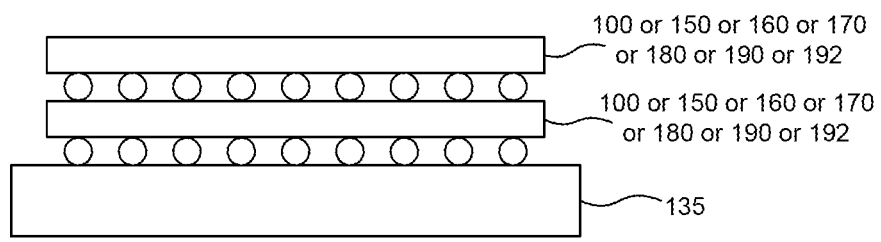
Figures 1, 2, 3, 4, 5, 6, 7, 8:
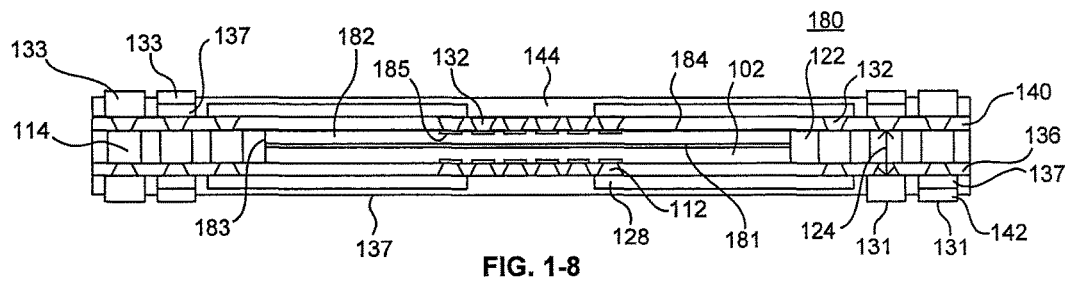
Figures 1, 2, 3, 4, 5, 6, 7, 8, 9:
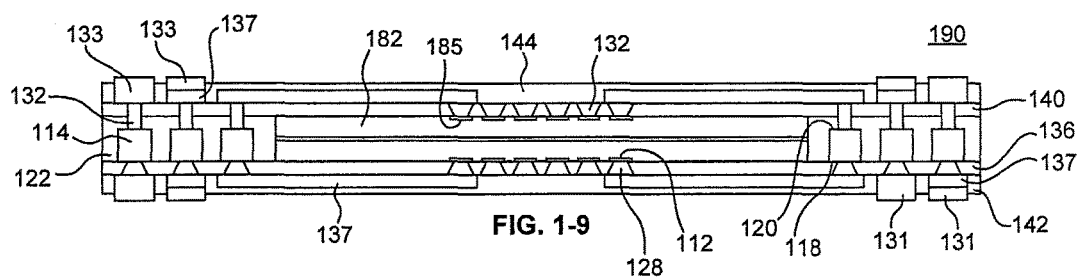
Figures 1, 2, 3, 4, 5, 6, 7, 8, 9, 10:
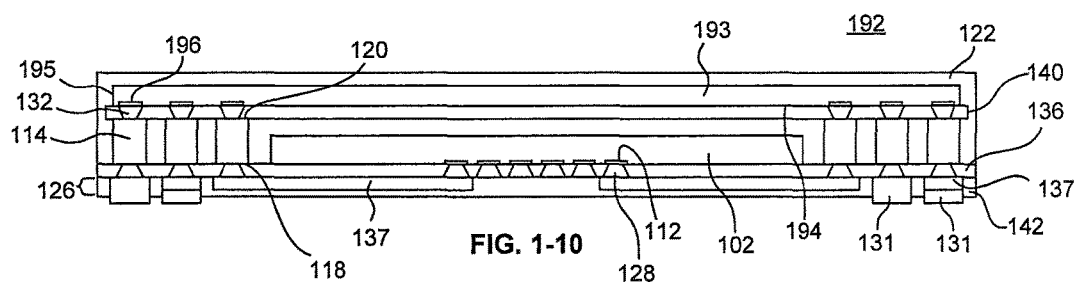
Figure 2:
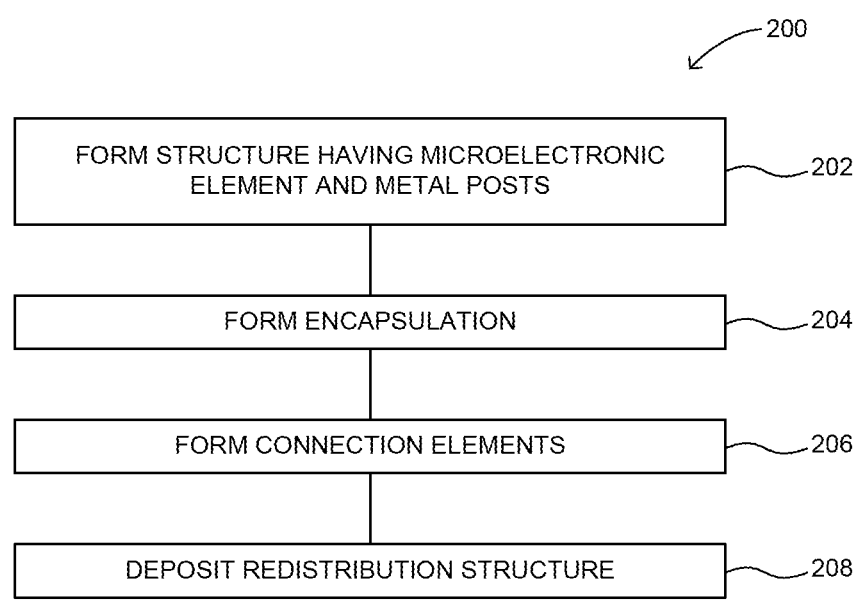
Figures 1, 6:
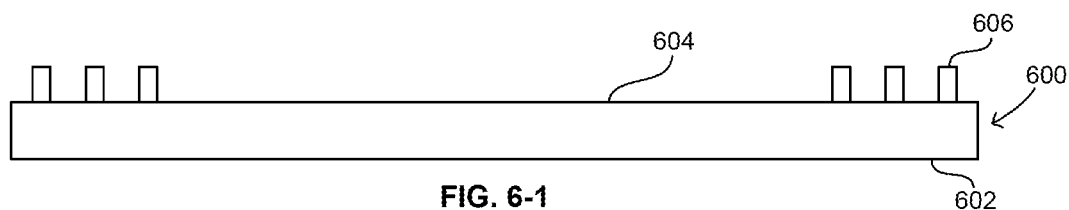
Figures 2, 6:
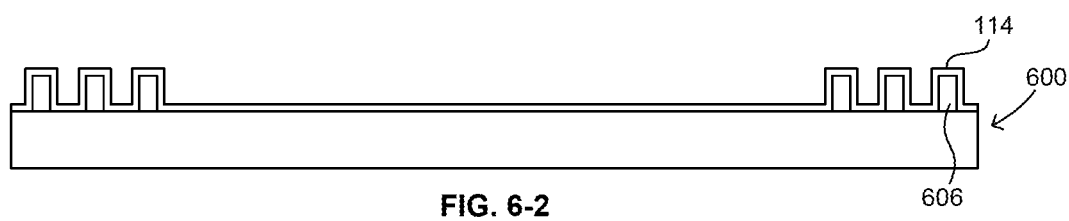
Figures 3, 6:
Figures 4, 6:
Figures 5, 6:

At 208, the redistribution structure 126 is deposited. As depicted in FIGS. 4-6, the redistribution structure 126 is overlying the insulation layers 136, 140. The redistribution structure 126 can include can include any embodiments and/or permutations and/or methods of fabrication as described for the fabrication of those elements in the microelectronic assembly 100.

Though described above as being sequentially fabricated on the first side 127 and second side 129 of the microelectronic assembly 160, the redistribution structure 126 can be fabricated by any suitable order of process steps.

FIGS. 5-1 through 5-6 depict stages in a method of fabricating the microelectronic assembly 150 in accordance with some aspects of the invention. Some aspects of fabricating the microelectronic assembly 150 are similar to those discussed above in regards to fabrication of the microelectronic assemblies 100 and 150.

FIG. 5-1 depicts the microelectronic element 102 supported on the front surface 104 by a carrier 500. A structure 502, as depicted in FIG. 5-2, may include the microelectronic element 102 supported by the carrier 500 at the front surface 104 and the metal posts 114 supported at second end surfaces 120 by a conductive layer 504. At 202, the structure 502 can be formed by attaching the first end surfaces 118 of the metal posts 114 to the carrier 500 such that the microelectronic element 102 is juxtaposed with a first portion 506 of a first surface 508 of the conductive layer 504. The metal posts 114 may be disposed between the first portion 506 of the first surface 508 and a corresponding edge of the conductive layer 504 and extending from the first surface 508.

Prior to attachment to the carrier 500, the metal posts 114 may be pre-formed on the first surface 508 of the conductive layer 504. The pre-forming of the metal posts 114 on the conductive layer 504 can include any embodiments and/or permutations and/or methods of fabrication as described for the pre-forming of the metal posts 114 on the conductive layers 302 or 402.

At 204, the encapsulation 122 can be formed. The encapsulation 122 can be formed by molding. As depicted in FIGS. 5-2 through 5-3, the second thickness 124 of the encapsulation 122 can be defined between the conductive layer 504 and the carrier 500. Though depicted as having a first thickness 108 less than the second thickness 124 of the encapsulation 122 in FIG. 5-3, the microelectronic element 102 may have a first thickness 108 equal to the second thickness 124 of the encapsulation 122 in some aspects of the invention.

After formation of the encapsulation 122, the carrier 500 and conductive layer 504 can be removed to expose the first and second end surfaces 118, 120, respectively, of the metal posts 114. The structure 400 is depicted after removed of the conductive layer 504 and the carrier 500 in FIG. 5-4. The conductive layer 504 and the carrier 500 can be removed by any suitable process, such as etching, polishing, or combinations thereof.

At 206 and 208, the insulation layers 136, 140, the connection elements 128, 130, and the redistribution structure 126 are formed as depicted in FIGS. 5-4 through 5-6 in one aspect of the invention. Forming the insulation layers 136, 140, the connection elements 128, 130, and the redistribution structure 126 includes any embodiments and/or permutations and/or methods of fabrication as described above with regards to forming the redistribution structure of the microelectronic assembly 100.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

For example, FIG. 6-1 through 6-5 depicts stages of fabrication of a microelectronic assembly in accordance with some embodiments of the invention. For example, the stages of fabrication depicted in FIGS. 6-1 through 6-5 may be used alternatively to those stages of fabrication depicted in FIGS. 3-1 through 3-2 or FIGS. 4-1 through 4-2. As depicted in FIG. 6-1, a substrate 600 can be provided. The substrate 600 can have a thickness extending in the first direction from a first surface 602 to a second surface 604. The substrate 600 can have rigid elements 606 extending in the first direction at the second surface 604 of the substrate 600. As depicted in FIG. 6-2, a conductive material can be deposited on the second surface 604 and surfaces of the rigid elements 606 to form metal posts 114 and conductive layer. The microelectronic element 102 can be attached to the conductive layer, and then the encapsulation 122 can be formed, such as depicted in FIG. 6-3. The substrate 600 may then be removed to reveal openings 608 in the metal posts 114. The openings in the metal posts 114 extending in the first direction from the front side 127 of the microelectronic assembly. The openings 608 can be filled with material, such as additional conductive material, as depicted in FIG. 6-5.

The invention claimed is:

1. A method of forming a microelectronic assembly, comprising:
   forming a structure including a microelectronic element having a front surface, edge surfaces bounding the front surface, and contacts at the front surface, and substantially rigid metal posts extending in a first direction, the posts disposed between at least one of the edge surfaces and a corresponding edge of the structure, each metal post having a sidewall separating first and second end surfaces of such metal post from one another, the sidewalls of the metal posts having a root mean square (rms) surface roughness of less than about 1 micron; and then,
   forming an encapsulation having a thickness extending in the first direction between first and second surfaces of the encapsulation, the encapsulation contacting at least the edge surfaces of the microelectronic element and the sidewalls of the metal posts, wherein the metal posts extend at least partly through the thickness, and the encapsulation electrically insulates adjacent metal posts from one another;

depositing an insulation layer overlying the first surface of the encapsulation and having a thickness extending away from the first surface of the encapsulation;

forming connection elements directly adjacent and extending away from the first end surfaces of the metal posts and through the thickness of the insulation layer, wherein at least some connection elements have cross sections smaller than respective cross sections of the metal posts from which the connection elements extend;

depositing an electrically conductive redistribution structure on the insulation layer, the redistribution structure electrically connecting at least some metal posts with the contacts of the microelectronic element; and forming terminals at a first side of the microelectronic assembly adjacent to the first surface of the encapsulation, wherein at least some of the at least some connection elements electrically connect at least some of the first end surfaces with corresponding terminals.

2. The method of claim 1, wherein, prior to forming the structure, the metal posts extend in the first direction from a first surface of a conductive layer, the posts disposed between a first portion of the first surface of the conductive layer and a corresponding edge of the conductive layer.

3. The method of claim 2, wherein forming the structure further comprises:
attaching the front surface of the microelectronic element to the first portion of the first surface of the conductive layer.

4. The method of claim 3, wherein, prior to forming the structure, the method further comprises:
providing a substrate having a thickness extending in the first direction from a first surface to a second surface of the substrate, the substrate having a plurality of rigid elements extending in the first direction at the second surface of the substrate; and
depositing a conductive material on the second surface of the substrate and surfaces of the rigid elements to form the metal posts and conductive layer.

5. The method of claim 4, wherein after forming the encapsulation, the method further comprises:
removing the substrate and the rigid elements to reveal openings in the metal posts, the openings in the metal posts extending in the first direction from the front surface of the microelectronic assembly; and
filling the openings with additional conductive material prior to depositing the insulation layer.

6. The method of claim 3, wherein, after forming the encapsulation and prior to depositing the insulation layer, the method further comprises:
removing the conductive layer to expose the first end surfaces of the metal posts.

7. The method of claim 6, further comprising:
forming a second insulation layer overlying the second surface of the encapsulation and having a thickness extending away from the second surface of the encapsulation;
forming second connection elements extending away from the second end surfaces of the metal posts and through the thickness of the second insulation layer, wherein at least some second connection elements have cross sections smaller than cross sections of the metal posts;
depositing an electrically conductive redistribution structure on the second insulation layer; and
forming second terminals at the second side of the microelectronic assembly adjacent to the second surface of the encapsulation, wherein the second terminals are overlying the redistribution structure, wherein the second connection elements electrically connecting at least some second end surfaces with corresponding second terminals through the redistribution structure.

8. The method of claim 6, further comprising:
forming openings extending between at least some second end surfaces of metal posts and the second surface of the encapsulation, the openings exposing at least portions of second end surfaces of the metal posts; and
forming second connection elements extending through the openings in the encapsulation and electrically connected to at least some metal posts at the second end surfaces.

9. The method of claim 2, wherein, prior to forming the structure, the front surface of the microelectronic element is attached to a carrier.

10. The method of claim 9, wherein forming the structure further comprises:
attaching the carrier to the metal posts such that the microelectronic element is juxtaposed with the first portion of the first surface of the conductive layer.

11. The method of claim 10, wherein the microelectronic element and the first portion of the first surface of the conductive layer are separated therefrom.

12. The method of claim 10, wherein, after forming the encapsulation, the method further comprises:
removing the carrier to expose the front surface of the microelectronic element and the second end surfaces of the metal posts; and
removing the conductive layer to expose the first end surfaces of the metal posts.

13. The method of claim 1, wherein the microelectronic further comprises a rear surface opposed to the front surface and a thickness extending between the front and rear surfaces of the microelectronic element, wherein the thickness of the encapsulation and the thickness of the microelectronic element are substantially the same.

14. The method of claim 1, wherein the microelectronic element further comprises a rear surface opposed to the front surface and a thickness extending between the front and rear surface, wherein the thickness of the encapsulation and the thickness of the microelectronic element are different.

15. The method of claim 1, wherein the insulation layer further includes first and opposed second surfaces, and the thickness of the insulation layer extends from the first surface to the second opposed surface.

16. The method of claim 1, wherein forming the connection elements further includes forming the at least some connection elements so that the at least some connection elements directly overlie and contact the metal posts.

17. The method of claim 1, wherein the connection elements include sidewalls having an rms surface roughness that is greater than the rms of the sidewalls of the metal posts.

18. A method of forming a microelectronic assembly, comprising:
providing a conductive layer with substantially rigid metal posts extending in a first direction away from a first surface of the conductive layer, the posts disposed between a first portion of the first surface of the conductive layer and a corresponding edge of the conductive layer; attaching a front surface of the microelectronic to a carrier and attaching the carrier to the metal posts so that the microelectronic element is juxtaposed with the first portion of a first surface of the conductive layer; and then forming a structure including a microelectronic element having edge surfaces bounding the front surface, and contacts at the front surface, the posts disposed between at least one of the edge surfaces and a corresponding edge of the structure, each metal post having a sidewall separating first and second end surfaces of such metal post from one another, the sidewalls of the metal posts having a root mean square (rms) surface roughness of less than about 1 micron;

forming an encapsulation having a thickness extending in the first direction between first and second surfaces of the encapsulation, the encapsulation contacting at least the edge surfaces of the microelectronic element and the sidewalls of the metal posts, wherein the metal posts extend at least partly through the thickness, and the encapsulation electrically insulates adjacent metal posts from one another;

depositing an insulation layer overlying the first surface of the encapsulation and having a thickness extending away from the first surface of the encapsulation;

forming connection elements extending away from the first end surfaces of the metal posts and through the thickness of the first insulation layer, wherein at least some connection elements have cross sections smaller than cross sections of the metal posts;

depositing an electrically conductive redistribution structure on the insulation layer, the redistribution structure electrically connecting at least some metal posts with the contacts of the microelectronic element; and forming terminals at a first side of the microelectronic assembly adjacent to the first surface of the encapsulation, wherein at least some of the at least some connection elements electrically connect at least some of the first end surfaces of the rigid posts with corresponding terminals.

19. The method of claim 18, wherein the microelectronic element and the first portion of the first surface of the conductive layer are separated therefrom.

20. The method of claim 18, wherein, after forming the encapsulation, the method further comprises:

removing the carrier to expose the front surface of the microelectronic element and the second end surfaces of the metal posts; and removing the conductive layer to expose the first end surfaces of the metal posts.

* * * * *